United States Patent
Murai et al.

(10) Patent No.: US 6,947,308 B2
(45) Date of Patent: Sep. 20, 2005

(54) EMBEDDED SEMICONDUCTOR MEMORY WITH CROSSBAR WIRINGS AND SWITCHES FOR HIGH BANDWIDTH

(75) Inventors: Katsumi Murai, Osaka (JP); Jun Horikawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 289 days.

(21) Appl. No.: 09/864,283

(22) Filed: May 25, 2001

(65) Prior Publication Data

US 2002/0054519 A1 May 9, 2002

(30) Foreign Application Priority Data

May 26, 2000 (JP) ....................................... 2000-156332

(51) Int. Cl.[7] ................................................. G11C 5/06
(52) U.S. Cl. .......................... 365/72; 365/63; 365/51; 365/190; 365/208; 365/207; 365/230.03
(58) Field of Search .............................. 365/63, 72, 51, 365/190, 207, 208, 189.05, 230.03

(56) References Cited

U.S. PATENT DOCUMENTS 5,379,248 A  1/1995 Wada et al. .................. 365/63
5,590,084 A * 12/1996 Miyano et al. ......... 365/230.01
5,715,202 A *  2/1998 Harima ........................ 365/200
5,943,253 A   8/1999 Matsumiya et al. .......... 365/63
6,175,516 B1  1/2001 Kitsukawa et al. ........... 365/63

FOREIGN PATENT DOCUMENTS

| EP | 0 935 252 | 8/1999 | ......... G11C/11/407 |
| JP | 8-255484  | 10/1996 | .......... G11C/11/41 |
| JP | 10-289581 | 10/1998 | ......... G11C/11/409 |

* cited by examiner

Primary Examiner—Andrew Q. Tran
(74) Attorney, Agent, or Firm—McDermott Will & Emery LLP

(57) ABSTRACT

The object of the invention is the provision of a semiconductor memory having processor and memory integrally mounted on one chip. To attain the object, crossbar wirings are laid on the memory cell area and crossbar switches are disposed in the sense amplifier area or word driver area. Accordingly, memory sharing is made possible without increasing the chip area and it is also made possible to take out a large number of data continuously. Hence, a memory-embedded system with a high bandwidth can be provided.

1 Claim, 18 Drawing Sheets

BUS

EMBEDDED SEMICONDUCTOR MEMORY WITH CROSSBAR WIRINGS AND SWITCHES FOR HIGH BANDWIDTH

TECHNICAL FIELD

The present invention relates to a semiconductor memory and a control method thereof and, more particularly, relates to a low-cost, high-performance and high-speed semiconductor memory constructed by having processor elements performing arithmetic functions and the like and a memory integrally mounted on one chip.

BACKGROUND ART

In recent years, as semiconductor devices become finer and finer in scale, an LSI constructed having processor elements and a memory integrally mounted on the same chip, the so-called system LSI or particularly embedded DRAM processor, has come to be realized. Further, for increasing processing speed and data bandwidth, a memory-embedded multiprocessor, i.e., a type having a plurality of processors and embedded memory units on one chip, is being proposed for performing parallel processing. The memory-embedded multiprocessors are classified into shared-memory type multiprocessors in which a plurality of processor elements share the access of a memory unit and multiprocessors of a type in which a plurality of processor elements each have its dedicated memory. In a microprocessor of a shared-memory type, in which all combinations of non-overlapping simultaneous access between each processor elements and each partitioned memory sub-units are simultaneously possible, such a system is sometimes used with a crossbar switch array for connections between each of the plurality of processor elements and the memory sub-units.

FIG. 16 is a drawing of prior-art example 1, which schematically shows a manner of connections between processor elements and memory units in a shared-memory type multiprocessor system. In a typical design, there are buses for data, addresses, and control signals, between processor elements and memory units. When the number of buses between a processor and memory units is N, and then if there are N buses provided as shown in FIG. 16, only one processor is allowed to access memory at a time. Which means a bus out of N buses is occupied for communication between the processor and memory. When processor elements simultaneously make requests for memory accesses, all other processors requesting memory access, but one having a current bus accessing privilege, must wait until the communications between this processor element and the memory is over and the bus becomes available. Accordingly, even when memory is divided into small capacity units, simultaneous access is limited to the maximum of available number of buses N. In FIG. 16, note that black circles at bus portions are not permanent bus connections but bus switch arrays and those connections are controlled to set up a bus route from a processor to a target memory.

FIG. 17 is a drawing which explains prior-art example 2. If M sets of N buses (here M<N) are provided as shown in FIG. 17, M processor elements are allowed to communicate with N memory units at the same time. However, since M×N buses are required, the number of buses becomes huge when the number of the processor elements increase. In the drawing, black circles at bus crossing portions are not permanent bus connections but switch arrays. Those switch arrays are controlled to set up a bus route from a processor to a target memory sub-group comprising of one or plural memory units so that the memories are interconnected.

FIG. 18 is a drawing which explains prior-art example 3. In the case of FIG. 18, crossbar areas are provided between processor elements and memory units and, by means of crossbar switches, processor elements and memories are interconnected. The typical crossbar circuit is designed literally to intersect vertical and horizontal lines to form crossbar with bus switch at the intersection point. By providing a path for direct connection between each processor element and each memory unit with the use of a bus switch, the crossbar switch system realizes simultaneous connections of all the combinations of processor elements and memories with smaller hardware size compared to example 2, though it is well known that cross-bar hardware is huge. Although it is not drawn in each figure of example 1, example 2 and example 3 described above, since a plurality of processor elements are not allowed to access the same memory unit at the same time, an arbiter circuit is provided for arbitrating simultaneous requests for accessing the same memory.

In the prior arts discussed above, since the crossbar switch areas must be provided between processor elements and memories as shown in FIG. 18, there is a problem of an increase in the chip space. This problem becomes more serious for large scale integrated system as processor elements and buses are increased in number and, consequently, the system employing the crossbar becomes expensive. If the crossbar switch kind of bus system is not used, it is impossible for a plurality of processor elements to access each target memory unit simultaneously. Therefore, especially for a memory-embedded multiprocessor, though the system performance can be improved by the increase in the bus bandwidth, the cost increases with the increase in the chip area.

In U.S. Pat. No. 5,379,248, a semiconductor memory is disclosed, which makes it possible to provide a more complicated bit line peripheral circuit without increasing the chip size. In this US Patent, ordinary bit lines are laid on a memory cell and other bit lines are laid over the ordinary bit lines so as to intersect the same. Therefore, emphasis is placed on getting more freedom in layout rather than on increasing the bandwidth.

In another patent U.S. Pat. No. 5,943,253, a semiconductor memory is disclosed, which makes it possible to transfer more data without increasing the chip area by providing first data buses and second data buses intersecting each other.

Although the configurations mentioned above include the constituents of the configuration of the present invention partly, they are not such that to attain high speed massive data operation and large bandwidth.

DISCLOSURE OF INVENTION

An object of the present invention is to obtain the merit of processor and memory integration on one chip, i.e., to obtain a larger bandwidth and achieve simultaneous access by processors to any of the memory addresses as effectively as possible, through the layout of data lines on the memory cell parallel with and orthogonal to the word lines and the arrangement of crossbar switches and wires for connecting related parallel and orthogonal data lines through crossbar switches laidout not at the intersection point of the first and the second data lines but in memory cell circumjacent area such as sense amplifier areas or word driver areas.

The semiconductor memory of the present invention, in more detail, comprises a plurality of memory cells arranged in a matrix, a plurality of bit line pairs each thereof being connected to each column of the plurality of the memory cells, sense amplifiers each connected to each bit line pair, a plurality of first gate pairs, a plurality of second gate pairs, a plurality of first data line pairs of each to be connected with one of the bit line pairs selected by means of the first gate pairs on activation, and a plurality of second data line pairs of each to be connected with one of the first data line pairs by means of the second gate pairs, wherein the first data line pairs and the second data line pairs are arranged to intersect each other.

By virtue of the configuration just described, first data line pairs normally used for memory data transfer can also be used as crossbar wirings and, hence, a reduction in the chip area can be attained.

Further, the semiconductor memory of the present invention comprises a plurality of memory cells arranged in a matrix, a plurality of bit line pairs each thereof being connected to each column of the plurality of the memory cells, sense amplifiers each connected to each bit line pair, a plurality of first gate pairs, a plurality of second gate pairs, a plurality of first data line pairs of each laidout on the memory cells, to be connected with one of the bit line pairs selected by means of the first gate pairs, on activation, and a plurality of second data line pairs of each, laidout on the memory cells, to be connected with one of the first data line pairs by means of the second gate pairs, wherein the first data line pairs and the second data line pairs are arranged to intersect each other.

By virtue of the configuration just described, crossbar wirings can be provided by the use of the memory cell area and therefore a reduction in the chip area can be attained. Further, by the use of the high layer of memory cell area as the wiring area, a much larger number of data line pairs can be laid as compared with the case where, for example, second data line pairs are arranged in the sense amplifier area. By having described configuration, simultaneous data communications performed with the use of the larger number of data line pairs, a high bandwidth system can be structured.

Further, the semiconductor memory of the invention is characterized by that the first and second gate pairs are laidout in the outer space of a memory cell array.

By virtue of the configuration just described, as an example of more effective layout, the crossbar switchers can be laidout in the area of bit line side of a memory cell arrays adjacent to the sense amplifiers area, and therefore, an increase in the chip area can be suppressed as contrasted to the conventional arrangement of them in the areas of intersection of the first data line pair and second data line pair. Besides, since the switches can be disposed in the active region of the sense amplifier area, an increase of the chip area can be suppressed.

Further, the semiconductor memory of the invention comprises a plurality of memory cells arranged in a matrix, a plurality of bit line pairs each thereof being connected to each column of the plurality of the memory cells, sense amplifiers each connected to each bit line pair, a plurality of first gates, a plurality of second gates, a plurality of first data lines of each to be connected with one Line of one of the bit line pairs selected by means of the first gates, on activation, and a plurality of second data lines of each to be connected with one line of one of the bit line pairs selected by means of the first gate pairs to be connected with one of the first data lines by means of the second gates, wherein the first data lines and the second data lines are arranged to intersect each other.

Although the advantage of differential data transfer of high speed and low power consumption are not obtained, by virtue of the configuration just described, twice as many data as are transferred by means of data line pair can be transferred and hence it is made possible to construct a high bandwidth system.

Further, the semiconductor memory of the invention comprises a plurality of memory cells arranged in a matrix array, a plurality of bit line pairs each thereof being connected to each column of the plurality of the memory cells, sense amplifiers each connected to each bit line pair, a plurality of first gate pairs, a plurality of second gate pairs, a plurality of first data line pairs of each to be connected on a time sharing basis with one of the bit line pairs selected by means of the first gate pairs, on activation, and a plurality of second data line pairs of each to be connected with one of the first data line pairs by means of the second gate pairs, wherein the first data line pairs and the second data line pairs are arranged to intersect each other.

According to the configuration just described, by arranging first data line pairs to be separately corresponding to each memory block, it is made possible to perform access, continuously with first access, to a memory block different from that accessed first, through second data line pair different from that used in the first access. Further, data transfer to and from a plurality of memory blocks can be continuously performed without producing contention, so that a great improvement in the bandwidth of the system can be realized.

Further, the semiconductor memory of the invention comprises one or a plurality of processor elements, a plurality of memory cells arranged in a array, a plurality of bit line pairs each thereof being connected to each column of the plurality of the memory cells, sense amplifiers each connected to each bit line pair, a plurality of first gate pairs, a plurality of second gate pairs, a plurality of first data line pairs of each to be connected with one of the bit line pairs selected by means of the first gate pairs, on activation, and a plurality of second data line pairs of each to be connected with one of the first data line pairs by means of the second gate pairs, wherein the first data line pairs and the second data line pairs are arranged to intersect each other.

By virtue of the configuration just described, a memory-embedded processor provided with a crossbar system can be realized on one chip. Therefore, a high-speed and low-power system can be provided.

Further, the semiconductor memory according to the invention, that N-th input-output data line of said processor elements is to be connected to N-th of said first gate and corresponding N-th said first data line, and those of each N-th arrangement is assigned to N-th partial chunk out of said plurality of bit line pairs, each thereof being connected to each column of the plurality of the memory cells, with a number of column of the product of M neighbor bit line pairs by N chunk. Here the bit data connection of N-th input-output data line of said processor elements between the processor elements and memory cells are assigned to transfer data corresponding to the N-th arrangement of the first gate pair of each to select one of the bit line pairs out of M neighbor columns. And each of all columns number of product of M by N is hereof being connected to each of the plurality of memory cells. The N-th first gate pair is to connect to each of N-th first data line pair and the N-th first line pair is to be connected to the N-th input output N line of each processor element via the second gate pairs and via the second data line pairs. M-th of N parallel bit data out of all columns of data in one time simultaneous read or write are transferred with a choice of the first gates By virtue of this configuration, succeeding M transferring words of N-bit data words are transferred between the memory and the processor in high speed, and as neighbor connection of wire is simple, a memory-embedded microprocessor chip is manufactured with small number of metal layers.

Further, the semiconductor memory according to the invention comprises one or a plurality of processor elements, a plurality of memory cells arranged in a matrix array, a plurality of bit line pairs each thereof being connected to each column of the plurality of the memory cells, sense amplifiers each connected to each bit line pair, a plurality of first gates, a plurality of second gates, a plurality of first data lines of each to be connected with one line of one of the bit line pairs selected by means of the first gates, on activation, and a plurality of second data lines of each to be connected with one of the first data lines by means of the second gates, wherein the first data lines and the second data lines are arranged to intersect each other.

By virtue of the configuration just described, a high-bandwidth memory-embedded processor provided with a crossbar system can be realized on one chip. Therefore, a high-speed and low-power system can be provided.

Further, the semiconductor memory according to the invention comprises one or a plurality of processor elements, a plurality of memory cells arranged in a matrix array, a plurality of bit line pairs each thereof being connected to each column of the plurality of the memory cells, a sense amplifiers each connected to each bit line pair, a plurality of first gate pairs, a plurality of second gate pairs, a plurality of first data line pairs of each to be connected on a time sharing basis with one of the bit line pairs selected by means of the first gate pairs, on activation, and a plurality of second data line pairs of each to be connected with one of the first data line pairs by means of the second gate pairs, wherein the first data line pairs and the second data line pairs are arranged to intersect each other.

According to the configuration just described, by arranging first data line pairs to be separately corresponding to each memory block, it is made possible to perform access, continuously with first access, to a memory block different from that accessed first, through second data line pairs different from that used in the first access. Further, data transfer to and from a plurality of memory blocks can be continuously performed without producing contention, so that a great improvement in the bandwidth of the system can be realized.

Further, the semiconductor memory of the invention comprises a plurality of processor elements, a plurality of memory cells arranged in a matrix array and organized into a plurality of memory block groups, a plurality of bit line pairs each thereof being connected to each column of the plurality of the memory cells, sense amplifiers each connected to each bit line pair, a plurality of first gate pairs, a plurality of second gate pairs, a plurality of first data line pairs of each to be connected with one of the bit line pairs selected by means of the first gate pairs, on activation, and a plurality of second data line pairs of each to be connected with one of the first data line pairs by means of the second gate pairs, wherein the first data line pairs and the second data line pairs are arranged to intersect each other.

By virtue of the configuration just described, a memory-embedded multiprocessor provided with a crossbar system can be realized on one chip. Therefore, a high-speed and low-power system can be provided.

Further, the semiconductor memory of the invention comprises a plurality of processor elements, a plurality of memory cells arranged in a matrix array and organized into a plurality of memory block groups, a plurality of bit line pairs each thereof being connected to each column of the plurality of the memory cells, sense amplifiers each connected to each bit line pair, a plurality of first gate, a plurality of second gate, a plurality of first data line pairs of each to be connected with one of the one line of the bit line pairs selected by means of the first gates, on activation, and a plurality of second data line pairs of each to be connected with one of the first data lines by means of the second gates, wherein the first data line and the second data line are arranged to intersect each other.

By virtue of the configuration just described, a high-bandwidth memory-embedded multiprocessor provided with a crossbar system can be realized on one chip. Therefore, a high-speed and low-power system can be provided.

Further, the semiconductor memory according to the invention comprises one or a plurality of processor elements, a plurality of memory cells arranged in a matrix array and organized into a plurality of memory block groups, a plurality of bit line pairs each thereof being connected to each column of the plurality of the memory cells, sense amplifiers each connected to each bit line pair, a plurality of first gate pairs, a plurality of second gate pairs, a plurality of first data line pairs of each to be connected on a time sharing basis with one of the bit line pairs selected by means of the first gate pairs, on activation, and a plurality of second data line pairs of each to be connected with one of the first data line pairs by means of the second gate pairs, wherein the first data line pairs and the second data line pairs are arranged to intersect each other.

By virtue of the configuration just described, a high-bandwidth memory-embedded multiprocessor provided with a crossbar system can be realized on one chip. Therefore, a high-speed and low-power system can be provided. Besides, in the memory-embedded multiprocessor, the input and output of each processor element can be connected with the crossbar system disposed on the memory side.

Further, the semiconductor memory of the invention further comprises a plurality of control means for controlling a plurality of memory cells organized into one or a plurality of memory block groups, wherein the control means each have a control signal for controlling each of the groups. Hereinafter, a plurality of memory cells will be called "memory cell array" or "cell array".

By virtue of the configuration just described, a system capable of making a plurality of accesses to a plurality of memory cell arrays simultaneously can be structured and, hence, a high-speed system can be provided.

Further, the semiconductor memory according to the invention is such that has the control means as part of the plurality of processor elements. By virtue of this configuration, a system, in a memory-embedded microprocessor, allowing a plurality of memory cell arrays to simultaneously make a plurality of accesses, such that, for example, a plurality of processor elements simultaneously access a plurality of memory cell arrays, and having a speed, at the maximum, equivalent to that of an existing system multiplied by the number of the processor elements can be structured.

In addition, the method for controlling a semiconductor memory according to the invention comprises making request for data communications by processor elements performing data communications with a plurality of memory cells organized into memory block groups, controlling data communications in response to the requests for data communications, and making data communications between the processor elements and the memory cells in accordance with the control signals under the control, wherein, in the step of controlling communications, control signals for controlling each of a plurality of memory cells organized into individual groups are used. By virtue of the arrangement just described, a high-speed system capable of controlling a plurality of simultaneous accesses to a plurality of memory cell array can be structured.

BEST MODE FOR CARRYING OUT THE INVENTION

Preferred embodiments of the invention will be described with reference to the accompanying drawings.
(First Exemplary Embodiment)
FIG. 1 to FIG. 3 are drawings explanatory of a first exemplary embodiment of the invention.

Figure 1:
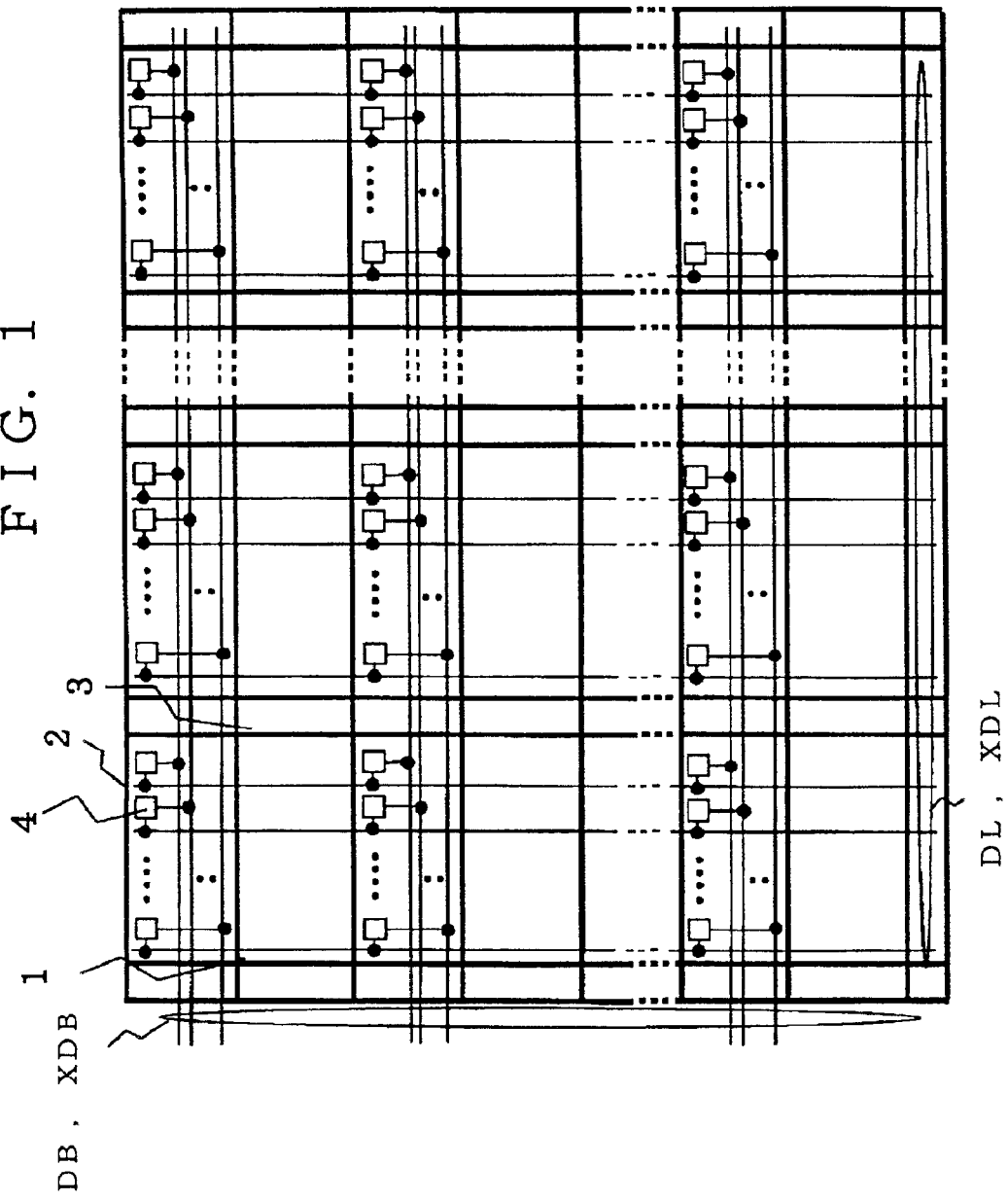
FIG. 1 is a system diagram of a semiconductor memory according to a first embodiment of the invention.

FIG. 1 schematically shows a structure of the semiconductor memory according to the first embodiment. FIG. 2 schematically shows a portion of the semiconductor memory shown in FIG. 1. In FIG. 1 and FIG. 2, memory cell array 1 is arranged in a matrix. In FIG. 1, only the outer frame of memory cell array 1 is shown. In FIG. 2, a block diagram of memory cell array 1 is shown. FIG. 1 shows the outer frame of sense amplifier row 2 and FIG. 2 shows a block diagram of sense amplifier row 2. In a real memory system, it is well known that there provided sense amplifiers of the same number as the number of the columns of memory cell array 1 in a matrix arrangement. A schematic of the sense amplifiers for typical memory cell columns of "column 0", "column m" and "column n" are shown in FIG. 2. Sub-word decoder array 3 is a decoder for a word signal. Switches 4 control the connection between first data line pairs DL, XDL and second data line pairs DB, XDB.

Figure 2:
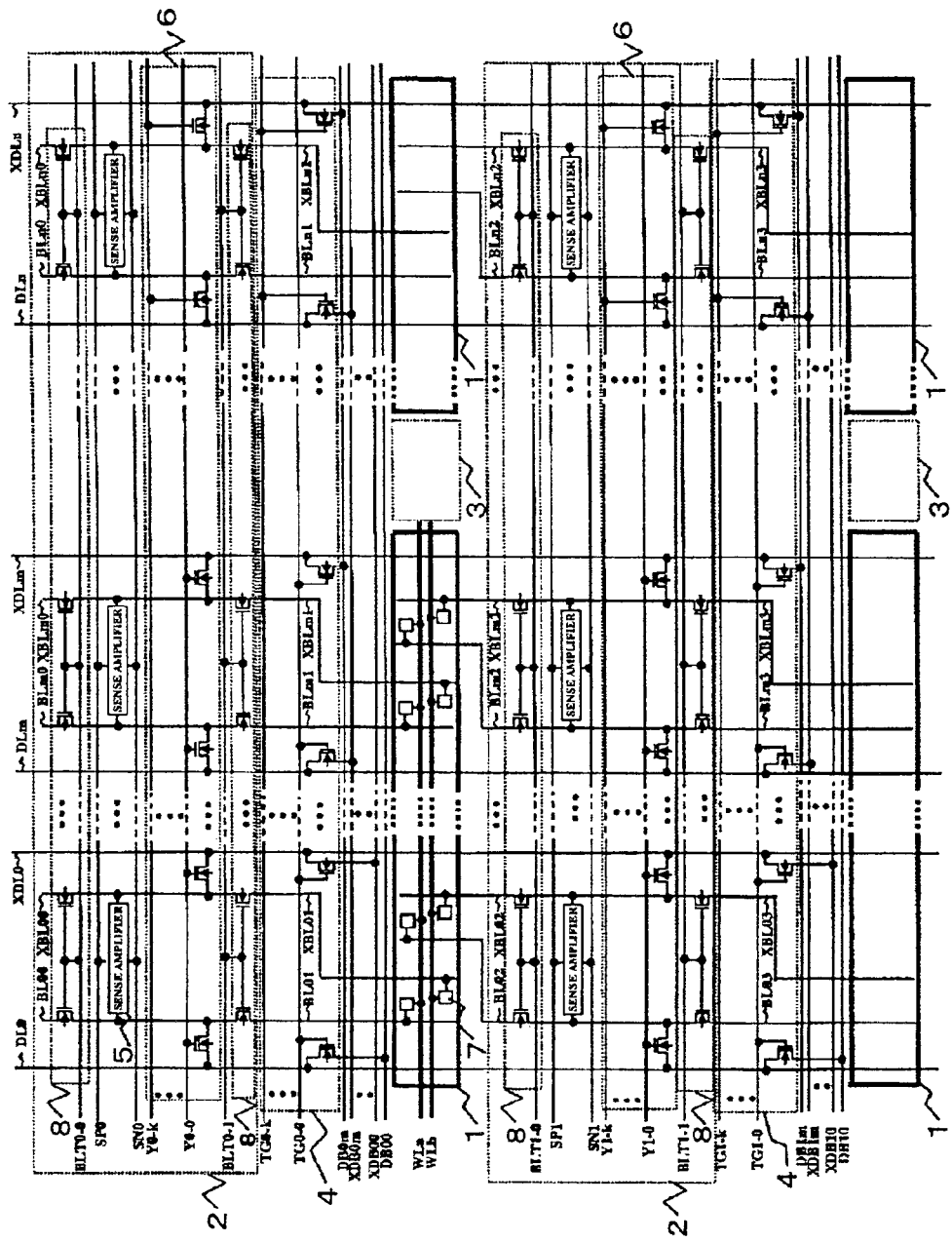
FIG. 2 is a diagram schematically showing a portion of the semiconductor memory shown in FIG. 1.
Figure 3:
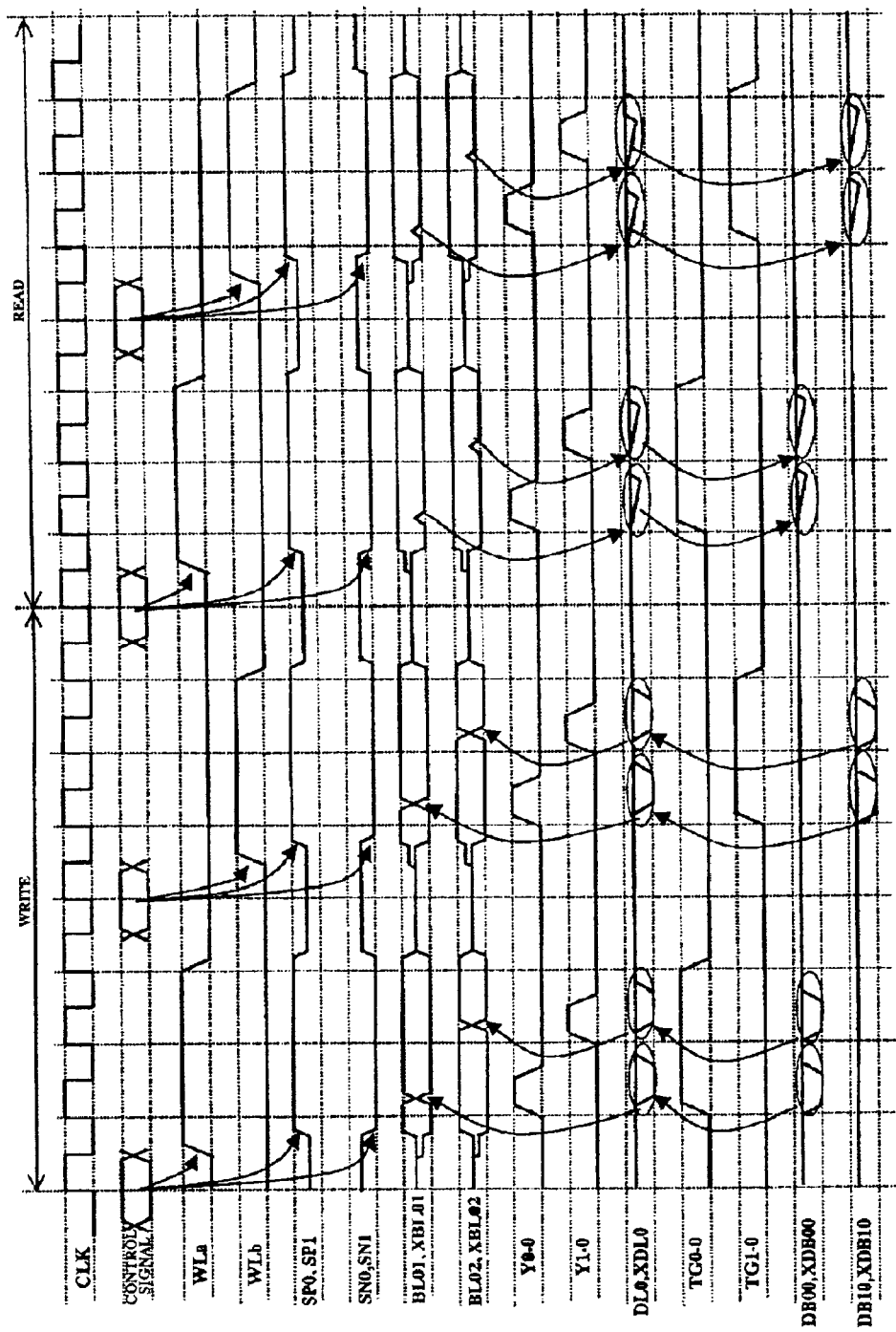
FIG. 3 is a timing chart showing operations in the semiconductor memory according to the first embodiment of the invention.

Although sense amplifiers 5 of each are generally formed of a latch circuit made up of two P-channel transistors and two N-channel transistors, it is shown in a simplified manner in FIG. 2. Switches 6 control the connection between bit line pairs BL, XBL and first data line pairs DL, XDL.

Although memory cells 7, in the case of DRAM, is generally formed of one transistor and one capacitor, it is shown in a simplified manner in FIG. 2. Although there are, in reality, word lines WL corresponding, in number, to the rows of memory cell array 1, there are shown only two lines (WLa, WLb) in FIG. 2. Selection gates 8 selects one of the upper and lower bit line pairs. Although sense amplifier row 2 further has a precharge circuit arranged for each bit line pair, it is omitted here.

FIG. 3 is a timing chart showing an example of operations in the semiconductor memory shown in FIG. 1 and FIG. 2. Operations in the first embodiment will be described below with reference to FIG. 3.

When a control signal is fed into the memory, synchronized with a rising edge of a clock (hereinafter called CLK), various pulses for controlling memory operations are generated. When the control signal is fed in and synchronized with rising edges of the first and ninth clocks in FIG. 3, word line WLa at the address designated by the control signal makes a transition from low level to high level. Following the transition of word line WLa to a high level, data in memory cells 7 connected to word line WLa are placed on bit line BL01–PLn2. Then, sense amplifier starting signals SP0, SP1 for the memory block designated by the control signal make a transition from precharge level to high level. Following the transition from precharge level to low level of SN0, SN1, sense amplifiers 5 are started and voltages on bit line pairs BL01–BLn2, XBL01–XBLn2 are amplified by sense amplifiers 5. Then, gate signal Y0-0 for switches 6 makes a transition from low level to high level so that bit line pairs BL01–BLm1, XBL01–XBLm1 are connected with first data line pairs DL0–DLm, XDL0–XDLm. Further, second data line pairs DB00–DB0m, XDB00–XDB0m selected by the control signal and first data line pairs DL0–DLm, XDL0–XDLm are connected together upon a transition from low level to high level of gate signal TG0-0 for switches 4.

In the case of a write operation, data are written, during this period of time, by a write circuit (not shown) into second data line pairs DB00–DB0m, XDB00–XDB0m and the written data are transmitted to first data line pairs DL0–DLm, XDL0–XDLm through switches 4. Further, the data are transmitted to bit line pairs BL01–BLm1, XBL01–XBLm1 through switches 6 so that the data are written into memory cells 7 connected to word line WLa through selection gates 8.

In the case of a read operation, voltages amplified by sense amplifiers 5 on bit line pairs BL01–BLm1, XBL01–XBLm1 are transmitted, during the same period of time, to first data line pairs DL0–DLm, XDL0–XDLm through switches 6. Further, the voltages are transmitted to second data line pairs DB00–DB0m, XDB00–XDB0m through switches 4. The voltages on second data line pairs DB00–DB0m, XDB00–XDB0m are amplified by read amplifiers (not shown) and the read out data are output.

Whether in read operation or in write operation, the precharging of the first data line pairs are performed while bit line pairs BL, XBL and first data line pairs DL, XDL are disconnected upon turning off of switches 6.

After the precharging of first data line pairs DL, XDL, gate signal Y1-0 for switches 6 makes a transition from low level to high level so that bit line pairs BL02–BLm2, XBL02–XBLm2 and first data line pairs DL0–DLm, XDL0–XDLm are connected together.

In the case of a write operation, data are written, during this period of time, by a write circuit (not shown) into second data line pairs DB00–DB0m, XDB00–XDB0m and the written data are transmitted to first data line pairs DL0–DLm, XDL0–XDLm through switches 4. Further, the data are transmitted to bit line pairs BL02–BLm2, XBL02–XBLm2 through switches 6 so that the data are written into memory cells 7 connected to word line WLa through selection gates 8.

In the case of a read operation, voltages amplified by sense amplifiers 5 on bit line pairs BL02–BLm2, XBL02–XBLm2 are transmitted, during the same period of time, to first data line pairs DL0–DLm, XDL0–XDLm through switches 6. Further, the voltages are transmitted to second data line pairs DB00–DB0m, XDB00–XDB0m through switches 4. The voltages on second data line pairs DB00–DB0m, XDB00–XDB0m are amplified by read amplifiers (not shown) so that the read out data are output.

As described above, even when, for example, bit line pairs BL01, XBL01 and BL02, XBL02 share common first data line pairs DL0, XDL0, it is possible to access all of the memory cells connected to word line WLa by reading and writing data at 2 CLK cycles (at the second and third clock cycles and 10th and 11th clock cycles in FIG. 3).

After the completion of the write operation/read operation, if it is needed to access memory cells connected to another word line in the same memory block, a precharging operation is carried out for preparation of next command receiving. Precharging is an operation to bring selected word line WL from high level to low level and to bring bit line pairs BL, XBL to a precharge level by means of a precharge circuit (not shown) and it is the same technology as applied in conventional DRAM and the like (refer to fourth, eighth, 12th, and 16th clock cycles in FIG. 3).

A case where access is made to other memory cells connected to second data line pairs DB10–DB1m, XDB10–XDB1m and word line WLb will be described. When a control signal is fed in synchronized with rising edges of fifth and 13th CLK in FIG. 3, word line WLb at the address designated by the control signal makes a transition from low level to high level. When word line WLb is changed to a high level, the data in memory cells 7 connected to word line WLb are placed on bit lines BL01–BLn2. Then, sense amplifier starting signals SP0, SP1 of the memory block designated by the control signal make a transition from precharge level to high level. Then, when signals SN0, SN1 make a transition from precharge level to low level, sense amplifiers 5 are (started >)activated and voltages on bit line pairs BL01–BLn2, XBL01–XBLn2 are amplified by sense amplifiers 5. Then, gate signal Y0-0 for switches 6 makes a transition from low level to high level, so that bit line pairs BL01–BLm1, XBL01–XBLm1 and first data line pairs DL0–DLm, XDL0–XDLm are connected together. Further, second data line pairs DB10–DB1m, XDB10–XDB1m selected by the control signal are connected with first data line pairs DL0–DLm, XDL0–XDLm upon a transition from low level to high level of gate signal TG1-0 for switches 4.

In the case of a write operation, data are written, during this period of time, into second data line pairs DB10–DB1m, XDB10–XDB1m by a write circuit (not shown) and the written data are transmitted to first data line pairs DL0–DLm, XDL0–XDLm through switches 4. Further, the data are transmitted to bit line pairs BL01–BLm1, XBL01–XBLm1 through switches 6 so that the data are written into memory cells 7 connected to word line WLb through selection gates 8.

In the case of a read operation, voltages amplified by sense amplifiers 5 on bit line pairs BL0–BLm1, XBL01–XBLm1 are transmitted, during the same period of time, to first data line pairs DL0–DLm, XDL0–XDLm through switches 6. Further, the voltages are transmitted to second data line pairs DB10–DB1m, XDB10–XDB1m through switches 4. The voltages on second data line pairs DB10–DB1m, XDB10–XDB1m are amplified by read amplifiers (not shown) so that the read out data are output.

Whether in read operation or in write operation, the precharging of the first data line pairs are performed while bit line pairs BL, XBL and first data line pairs DL, XDL are disconnected upon turning off of switches 6.

After the precharging operation of first data line pairs DL, XDL, gate signal Y1-0 for switches 6 makes a transition from low level to high level so that bit line pairs BL02–BLm2, XBL02–XBLm2 and first data line pairs DL0–DLm, XDL0–XDLm are connected together.

In the case of a write operation, data are written, during this period of time, into second data line pairs DB10–DB1m, XDB10–XDB1m by a write circuit (not shown) and the written data are transmitted to first data line pairs DL0–DLm, XDL0–XDLm through switches 4. Further, the voltages are transmitted to bit line pairs BL02–BLm2, XBL02–XBLm2 through switches, 6 so that the data are written into memory cells 7 connected to word line WLb through selection gates 8.

In the case of a read operation, voltages amplified by sense amplifiers 5 on bit line pairs BL02–BLm2, XBL02–XBLm2 are transmitted, during the same period of time, to first data line pairs DL0–DLm, XDL0–XDLm through switches 6. Further, the voltages are transmitted to second data line pairs DB10–DB1m, XDB10–XDB1m through switches 4. The voltages on second data line pairs DB10–DB1m, XDB10–XDB1m are amplified by read amplifiers (not shown) so that the read out data are output.

Thus, according to the first embodiment, first data lines normally used for memory data transfer can also be used as crossbar wirings and, hence, an increase in the chip area can be suppressed.

(Second Exemplary Embodiment)

Figure 4:
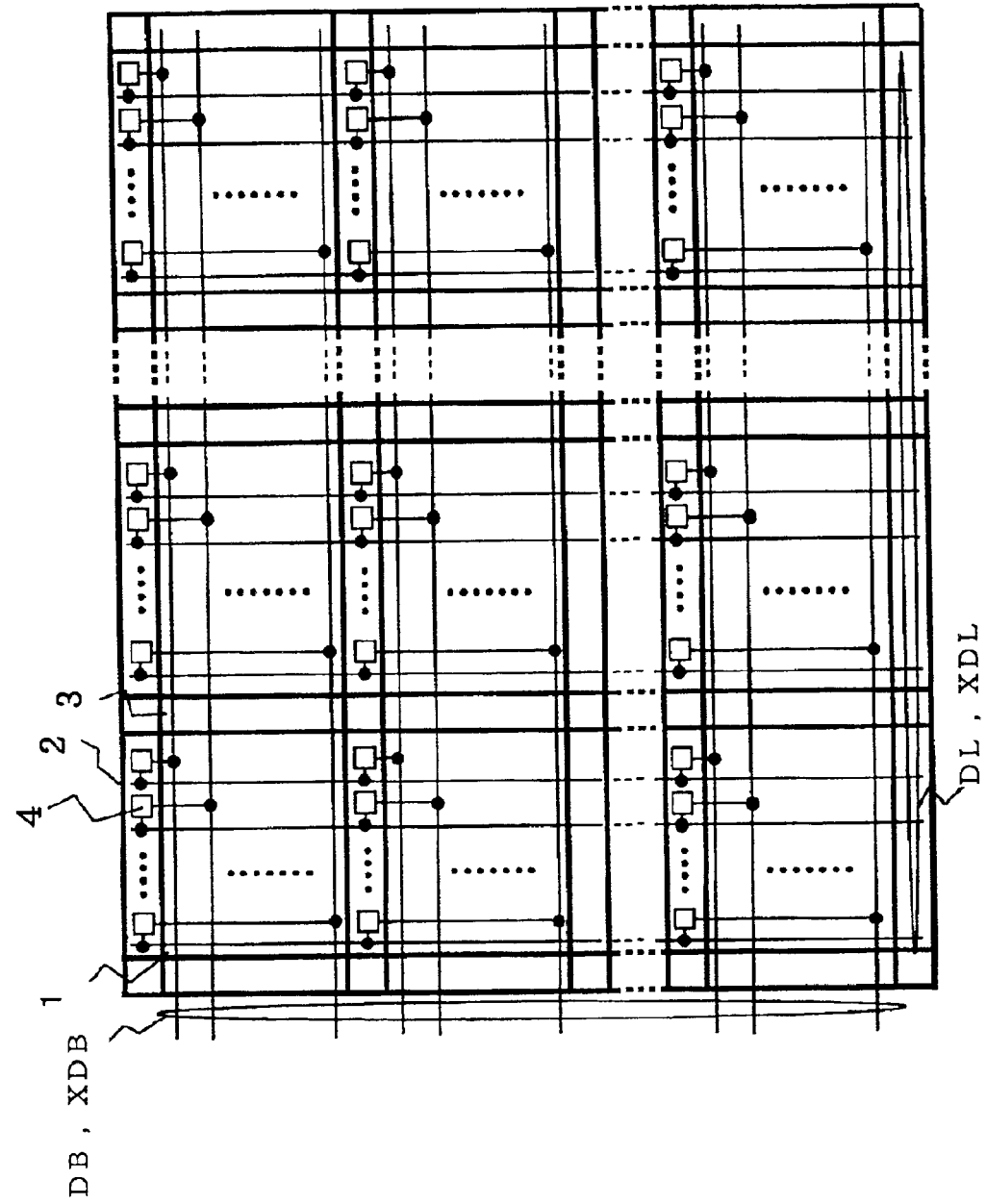
FIG. 4 is a system diagram of a semiconductor memory according to a second embodiment of the invention.
Figure 5:
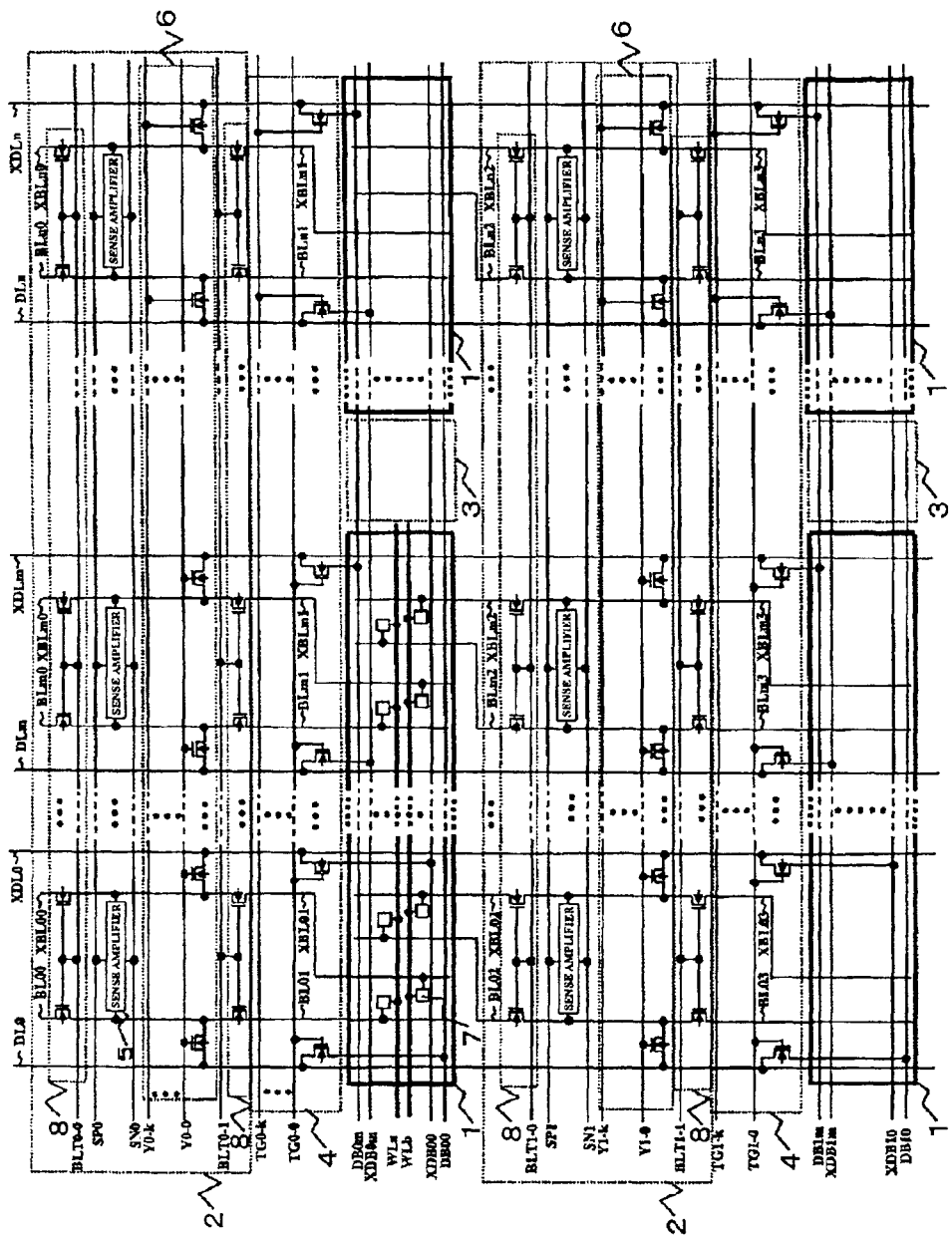
FIG. 5 is a diagram schematically showing a portion of the semiconductor memory shown in FIG. 4.

FIG. 4 and FIG. 5 are drawings explanatory of a second exemplary embodiment of the invention. FIG. 4 schematically shows a structure of a semiconductor memory according to the second embodiment. FIG. 5 schematically shows a portion of the semiconductor memory shown in 4.

The second embodiment, as shown in FIG. 4, has the second data line pairs (DB, XDB) in the above described first embodiment (FIG. 1, FIG. 2) laidout on the memory cell array 1. According to the second embodiment, it becomes possible to layout the crossbar wiring over the memory cells so that the chip size can be reduced.

Further, by the use of the area on the memory cell array as the wiring area, a much larger number of data wires can be laid as compared, for example, with the first embodiment in which the second data lines were disposed in the domain of the sense amplifier rows. Further, by having simultaneous data communications performed with the memory by the use of the large number of data lines, it becomes possible to structure a high bandwidth system.

(Third Exemplary Embodiment)

Figure 6:
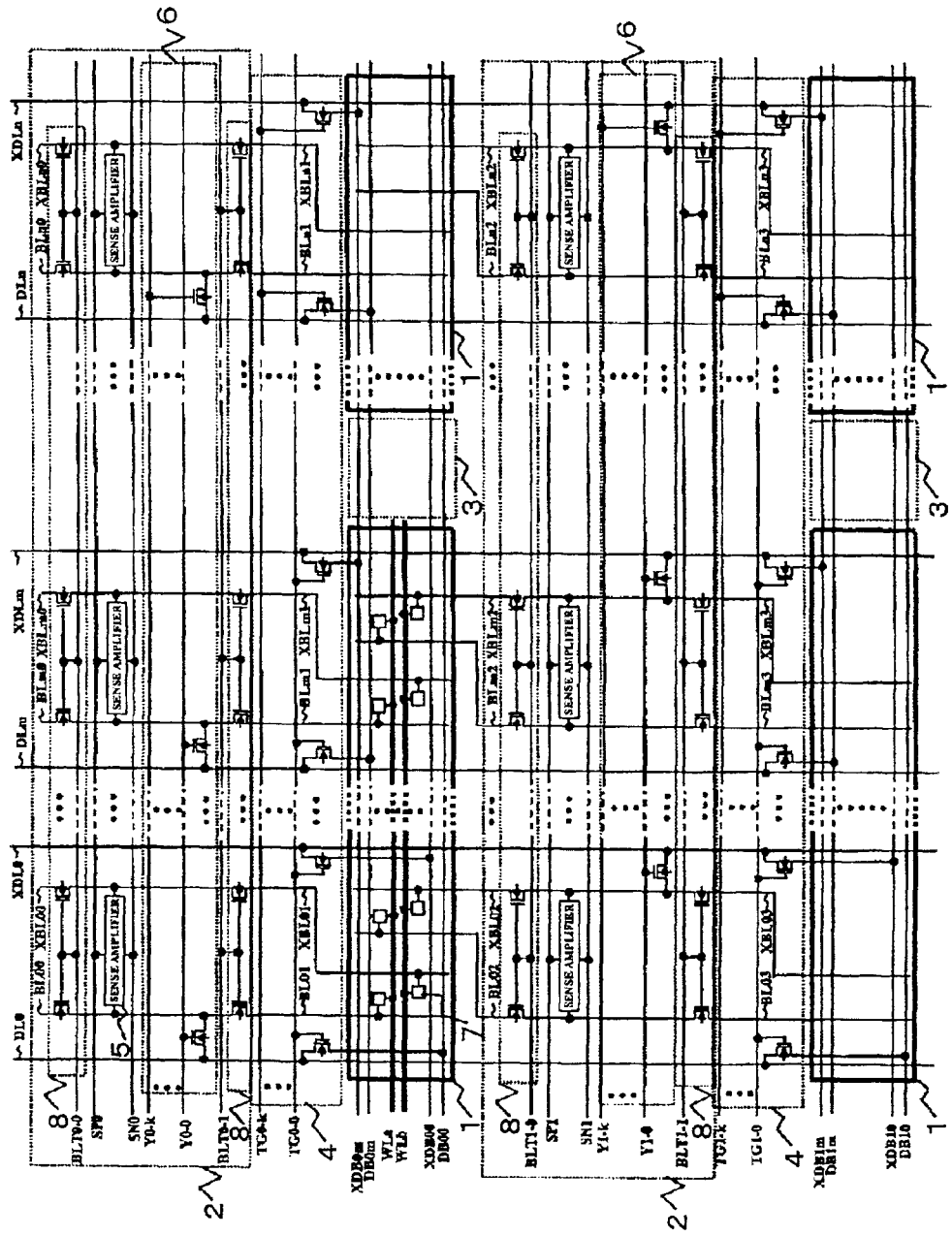
FIG. 6 is a diagram schematically showing a portion of a third embodiment of the invention.
Figure 7:
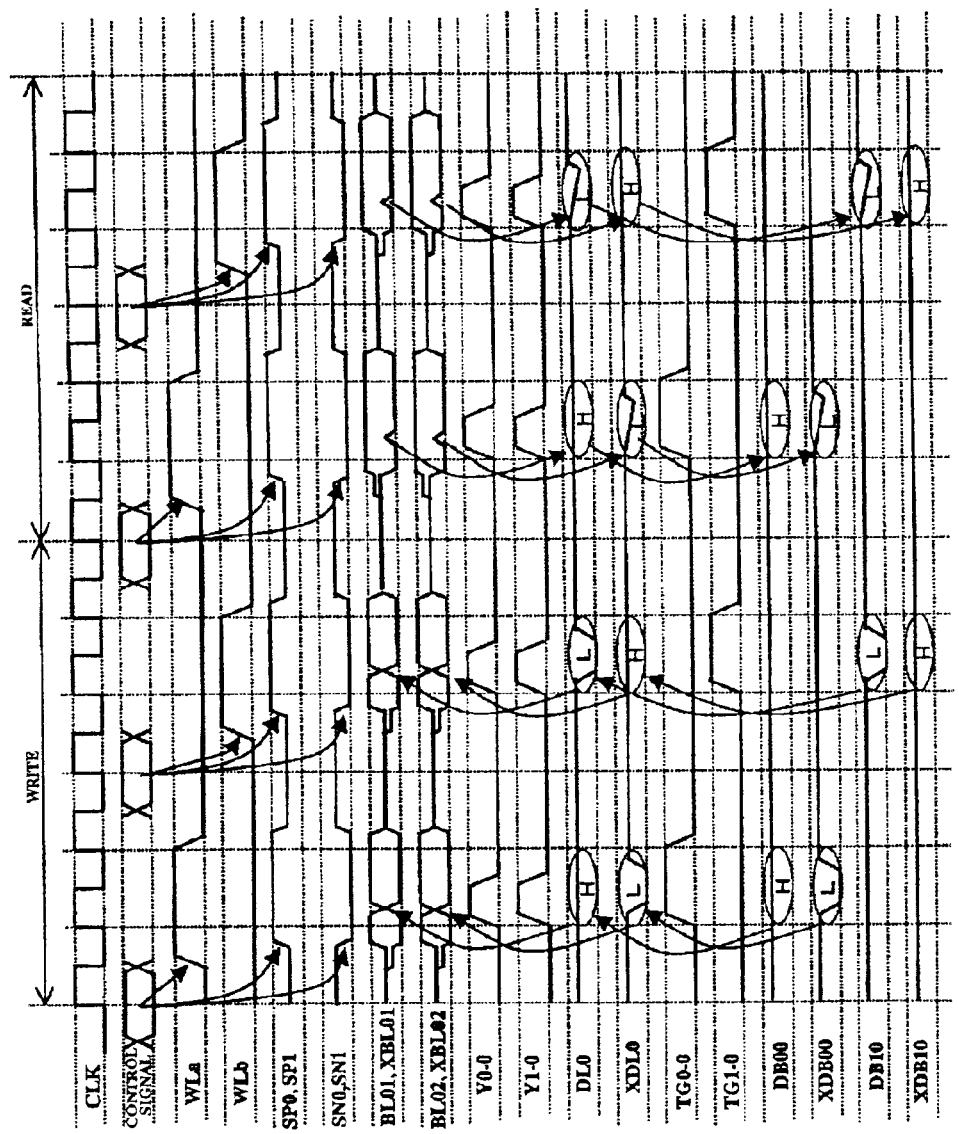
FIG. 7 is a timing chart showing operations in the semiconductor memory according to the third embodiment of the invention.

FIG. 6 and FIG. 7 are drawings explanatory of a third exemplary embodiment of the invention.

FIG. 6 schematically shows a portion of the semiconductor memory according to the third embodiment.

FIG. 7 is a timing chart showing an example of operations in the semiconductor memory shown in FIG. 6.

In FIG. 6, the third embodiment has the first data lines (DL, XDL) and second data lines (DB, XDB) in the above described second embodiment (FIG. 5) provided in a single-bus structure.

When a control signal is fed into the semiconductor memory in synchronized with a rising edge of a CLK, various pulses for controlling memory operations are generated. When the control signal is fed in synchronized with the rising edges of the first and seventh clocks in FIG. 7, word line WLa at the address designated by the control signal makes a transition from low level to high level. Following the transition of word line WLa to a high level, data in memory cells 7 connected to word line WLa are placed on bit line BL01–PLn2. Then, sense amplifier starting signals SP0, SP1 for the memory cell array designated by the control signal make a transition from precharge level to high level. Following the transition from precharge level to low level of SN0, SN1, sense amplifiers 5 are started so that data on bit line pairs BL01–BLn2, XBL01–XBLn2 are amplified by sense amplifiers 5. Then, gate signals Y0-0 and Y1-0 for switches 6 make a transition from low level to a high level, so that bit lines BL01–BLm1 are connected with first data line pairs DL0–DLm and bit lines XBL02–XBLm2 are connected with first data lines XDL0–XDLm. Further, second data line pairs DB00–DB0m, XDB00–XDB0m selected by the control signal and first data line pairs DL0–DLm, XDL0–XDLm are connected together upon a transition from low level to high level of gate signal TG0-0 for switches 4.

In the case of a write operation, data are written, during this period of time, into second data line pairs DB00–DB0m, XDB00–XDB0m by a write circuit (not shown) and the written data are transmitted to first data line pairs DL0–DLm, XDL0–XDLm through switches 4. Further, the data are transmitted to bit line pairs BL01–BLm1, XBL02–XBLm2 through switches 6 so that the data are written into memory cells 7 connected to word line WLa through selection gates 8.

In the case of a read operation, voltages amplified by sense amplifiers 5 on bit lines BL01–BLm0, XBL02–XBLm2 are transmitted, during the same period of time, to first data line pairs DL0–DLm, XDL0–XDLm through switches 6. Further, the voltages are transmitted to second data line pairs DB00–DB0m, XDB00–XDB0m through switches 4. The voltages on second data line pairs DB00–DB0m, XDB00–XDB0m are compared with a preset precharge level and amplified by read amplifiers (not shown) and the read out data are output.

Whether in read operation or in write operation, the precharging of the first data lines are performed while bit line pairs BL, XBL and first data lines DL, XDL are disconnected upon turning off of switches 6.

After the completion of the write operation/read operation, if it is needed to access memory cells connected to another word line in the same memory block, a precharging operation is carried out for preparation of next command receiving(refer to third, sixth, ninth, and 12th clock cycles in FIG. 7).

A case where access is made to memory cells connected to another second data line pairs DB10–DB1m, XDB10–XDB1m and word line WLb will be described. When a control signal is fed in and synchronized with rising edges of fourth and 10th CLK in FIG. 7, word line WLb at the address designated by the control signal makes a transition from low level to high level. When word line WLb has made the transition to a high level, the data in memory cells 7 connected to word line WLb are placed on bit line BL01–BLn2. Then, sense amplifier starting signals SP0, SP1 of the memory cell array designated by the control signal make a transition from precharge level to high level. Then, when signals SN0, SN1 make a transition from precharge level to low level, sense amplifiers 5 are started and voltages on bit line pairs BL01–BLn2, XBL01–XBLn2 are amplified by sense amplifiers 5. Then, gate signals Y0-0 and Y1-0 for switches 6 make a transition from low level to high level, so that bit lines BL01–BLm1 is connected with first data lines DL0–DLm and bit lines XBL02–XBLm2 is connected with first data lines XDL0–XDLm. Further, second data line pairs DB10–DB1m, XDB10–XDB1m selected by the control signal and first data line pairs DL0–DLm, XDL0–XDLm are connected together upon a transition from low level to high level of gate signal TG1-0 for switches 4.

In the case of a write operation, data are written, during this period of time, into second data line pairs DB10–DB1m, XDB10–XDB1m by a write circuit (not shown) and the written data are transmitted to first data line pairs DL0–DLm, XDL0–XDLm through switches 4. Further, the data are transmitted to bit lines BL01–BLm1, XBL02–XBLm2 through switches 6 so that the data are written into memory cells 7 connected to word line WLb through selection gates 8.

In the case of a read operation, voltages amplified by sense amplifiers 5 on bit line pairs BL01–BLm0, XBL02–XBLm2 are transmitted, during the same period of time, to first data line pairs DL0–DLm, XDL0–XDLm through switches 6. Further, the voltages are transmitted to second data line pairs DB10–DB1m, XDB10–XDB1m through switches 4. The voltages on second data line pairs DB10–DB1m, XDB10–XDB1m are compared with a preset precharge level and amplified by read amplifiers (not shown) and the read out data are output.

Thus, according to the third embodiment, twice as many data as are transferred by means of data line pairs can be transferred during the same time period and it is made possible to structure a high bandwidth system.

(Fourth Exemplary Embodiment)

Figure 8:
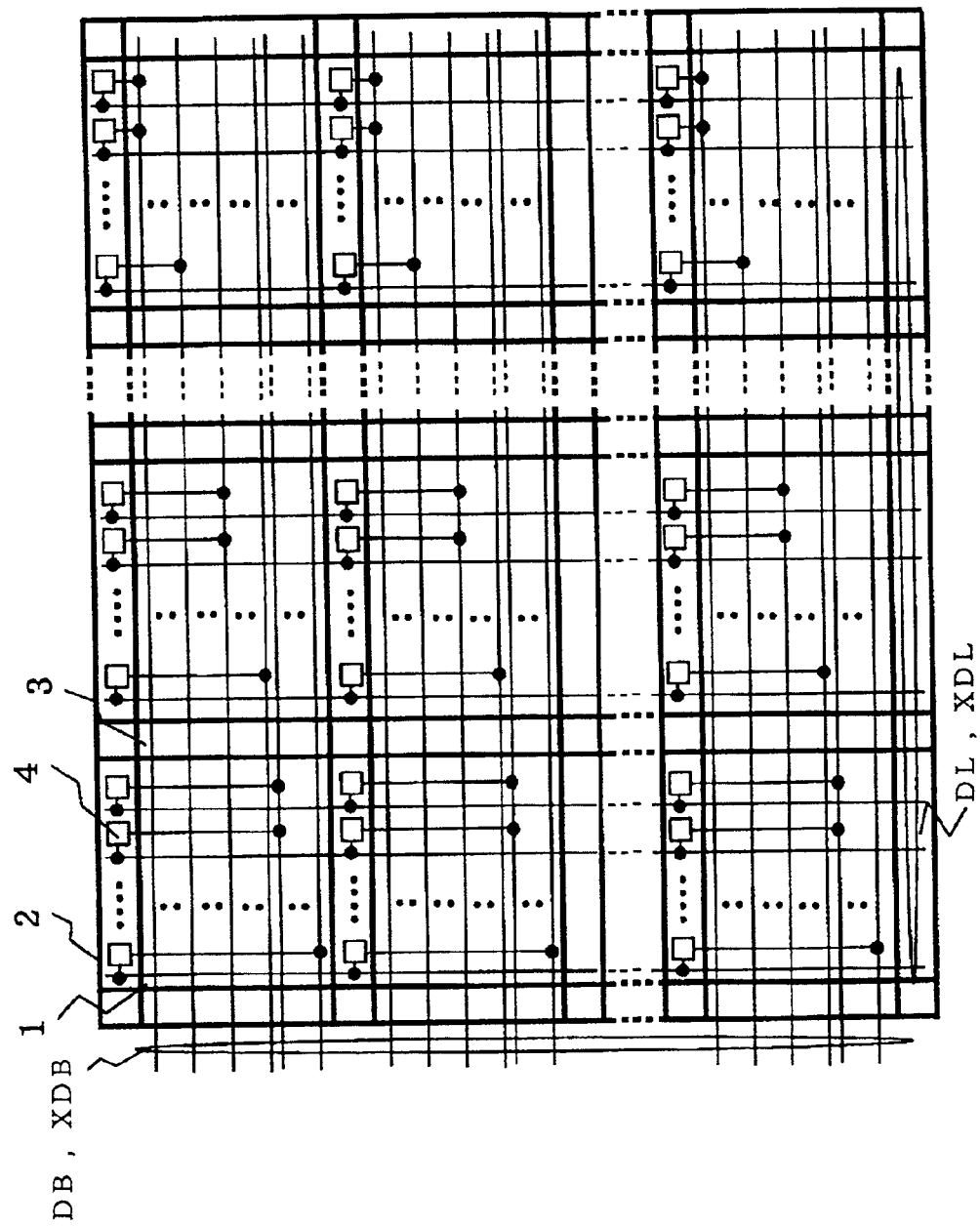
FIG. 8 is a system diagram of a semiconductor memory according to a fourth embodiment of the invention.
Figure 9:
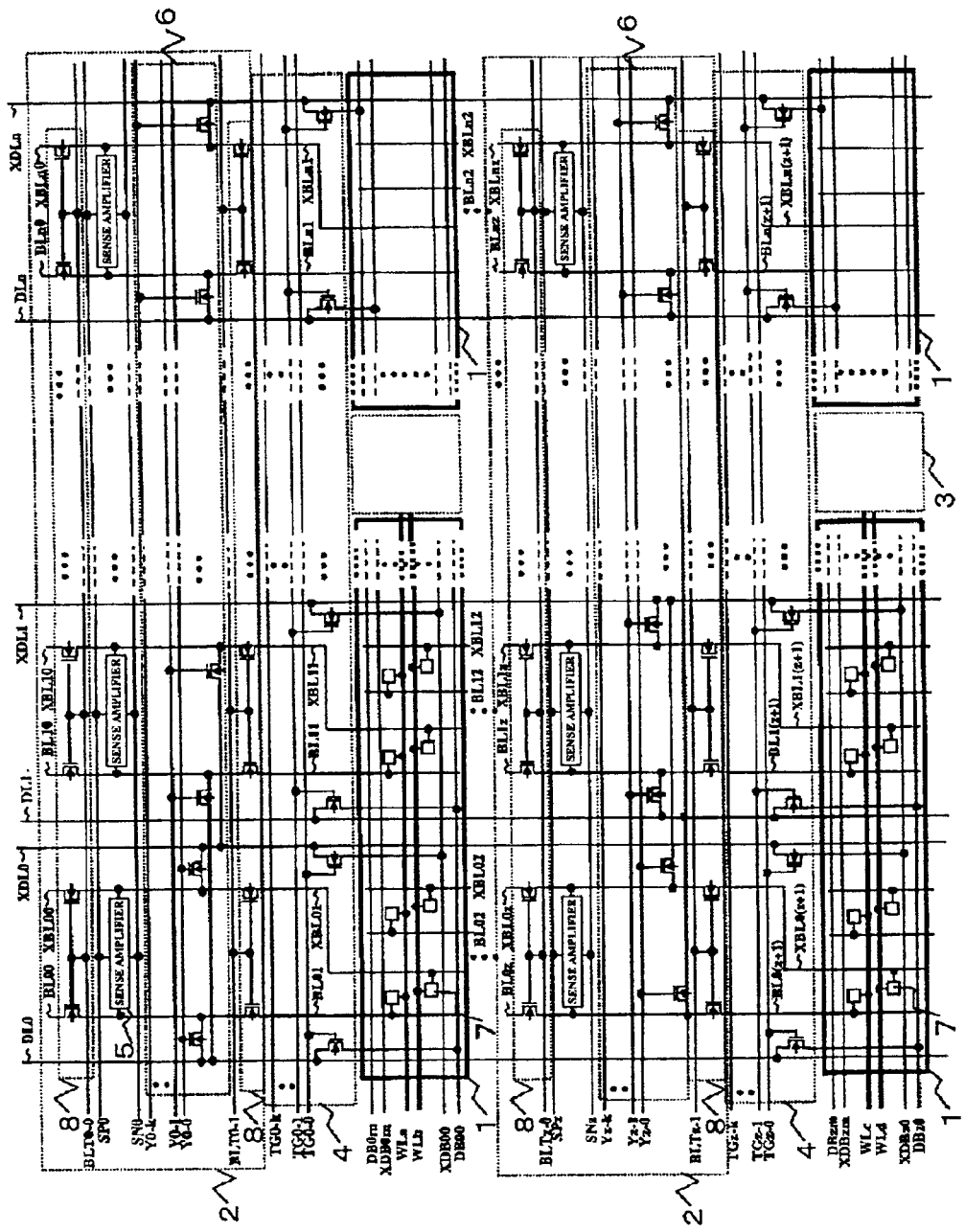
FIG. 9 is a diagram schematically showing a portion of the semiconductor memory shown in FIG. 8.
Figure 10:
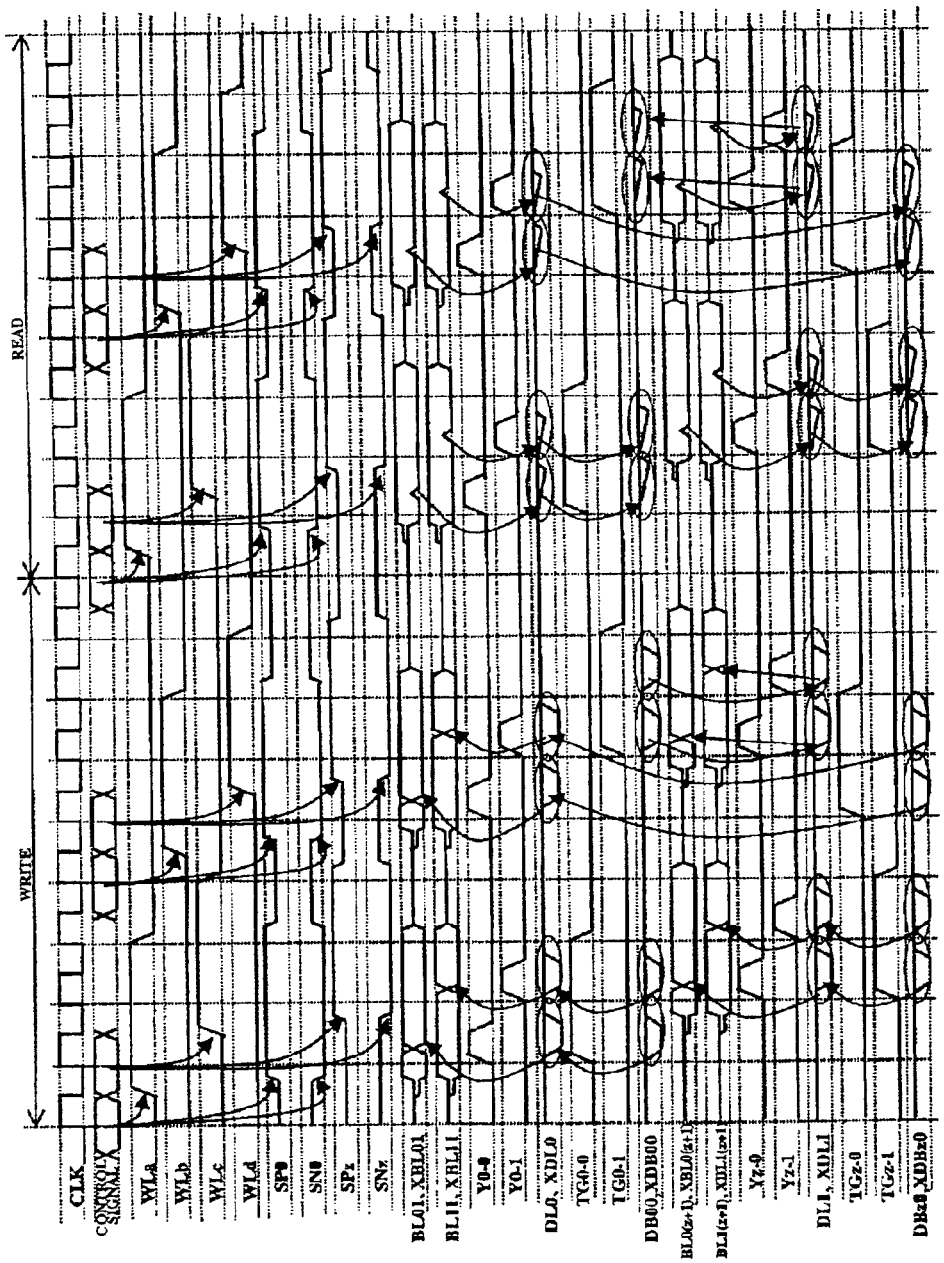
FIG. 10 is a timing chart showing operations in the semiconductor memory according to the fourth embodiment of the invention.

FIG. 8 to FIG. 10 are drawings explanatory of a fourth exemplary embodiment of the invention. FIG. 8 schematically shows a structure of the semiconductor memory according to the fourth embodiment. FIG. 9 schematically shows a portion of the semiconductor memory shown in FIG. 8. FIG. 10 is a timing chart of operations in the semiconductor memory shown in FIG. 8 and FIG. 9.

The fourth embodiment in FIG. 8 and FIG. 9 is different from the above second embodiment (FIG. 4, FIG. 5) in the manner of connection of switches 4 and the manner of connection of switches 6.

When a control signal is fed into the semiconductor memory in synchronized with a rising edge of a CLK, various pulses for controlling memory operations are generated. When the control signal is fed in synchronized with the rising edges of the first and 10th clocks in FIG. 10, word line WLa at the address designated by the control signal makes a transition from low level to high level. Following the transition of word line WLa to a high level, data in memory cells 7 connected to word line WLa are placed on bit lines BL01–PLn2. Then, sense amplifier starting signals SP0, SP1 (not shown) for the memory cell array designated by the control signal make a transition from precharge level to high level. Following the transition from precharge level to low level of SN0, SN1 (not shown), sense amplifiers 5 are started, so that voltages on bit line pairs BL01–BLn2, XBL01–XBLn2 are amplified by the sense amplifiers. Then, gate signal Y0-0 for switches 6 makes a transition from low level to high level, so that bit line pairs BLx1, XBLx1 (x represents even numbers from 0 to n) are connected with first data line pairs DLx, XDLx (x represents even numbers from 0 to n). Further, second data line pairs DB00–DB0m, XDB00–XDB0m selected by the control signal and first data line pairs DLx, XDLx (x represents even numbers from 0 to n) are connected together upon a transition from low level to high level of gate signal TG0-0 for switches 4.

In the case of a write operation, data are written, during this period of time, into second data line pairs DB00–DB0m, XDB00–XDB0m by a write circuit (not shown) and the written data are transmitted to first data line pairs DLx, XDLx (x represents even numbers from 0 to n) through switches 4. Further, the data are transmitted to bit line pairs BLx1, XBLx1 (x represents even numbers from 0 to n) through switches 6 so that the data are written into memory cells 7 connected to word line WLa through selection gates 8.

In the case of a read operation, voltages amplified by sense amplifiers 5 on bit line pairs BLx1, XBLx1 (x represents even numbers from 0 to n) are transmitted, during the same period of time, to first data line pairs DLx, XDLx (x represents even numbers from 0 to n) through switches 6. Further, the voltages are transmitted to second data line pairs DB00–DB0m, XDB00–XDB0m through switches 4. The voltages on second data line pairs DB00–DB0m, XDB00–XDB0m are amplified by read amplifiers (not shown) and the read out data are output.

Whether in read operation or in write operation, the precharging of the first data line pairs are performed while bit line pairs BL, XBL and first data line pairs DL, XDL are disconnected upon turning off of switches 6.

After the precharging of first data line pairs DL, XDL, gate signal Y0–1 for switches 6 makes a transition from low level to high level so that bit line pairs BLy1, XBLy1 (y represents odd numbers from 0 to n) and first data line pairs DLx, XDLx (x represents even numbers from 0 to n) are connected together.

In the case of a write operation, data are written, during this period of time, into second data line pairs DB00–DB0m, XDB00–XDB0m by a write circuit (not shown) and the written data are transmitted to first data line pairs DLx, XDLx (x represents even number from 0 to n) through switches 4. Further, the data are transmitted to bit line pairs BLy1, XBLy1 (y represents odd numbers from 0 to n) through switches 6 so that the data are written into memory cells 7 connected to word line WLa through selection gates 8.

In the case of a read operation, voltages amplified by sense amplifiers 5 on bit line pairs BLy1, XBLy1 (y represents odd numbers from 0 to n) are transmitted, during the same period of time, to first data line pairs DLx, XDLx (x represents even numbers from 0 to n) through switches 6. Further, the voltages are transmitted to second data line pairs DB00–DB0m, XDB00–XDB0m through switches 4. The voltages on second data line pairs DB00–DB0m, XDB00–XDB0m are amplified by read amplifiers (not shown) and the read out data are output.

When access is that to a memory cell array and second data line pairs other than the memory cell array and the second data line pairs designated by the control signal at the first and 10th clock cycles, continuous operation can be made. Operation relative to it will be described below.

When a control signal is fed in synchronized with the rising edges of the second and 11th clocks in FIG. 10 for accessing a memory cell array different from that designated at the first and 10th clock cycles, word line WLc at the address designated by the control signal makes a transition from low level to high level. Following the transition of word line WLc to a high level, data in memory cells 7 connected to word line WLc are placed on bit lines BL0(z+1)–BLn(z+2). Then, sense amplifier starting signals SPz, SP(z+1) (not shown) for the memory block designated by the control signal make a transition from precharge level to high level. Following the transition from precharge level to low level of SNz, SN(z+1) (not shown), sense amplifiers 5 are started, so that bit line pairs BL0(z+1)–BLn(z+2), XBL0(z+1)–XBLn(z+2) are amplified by the sense amplifiers. Then, gate signal Yz-0 for switches 6 makes a transition from low level to high level, so that bit line pairs BLx(z+1), XBLx(z+1) (x represents even numbers from 0 to n) are connected with first data line pairs DLy, XDLy (x represents odd numbers from 0 to n). Further, second data line pairs DBz0–DBzm, XDBz0–XDBzm selected by the control signal and first data line pairs DLy, XDLy (x represents odd numbers from 0 to n) are connected together upon a transition from low level to high level of gate signal TGz–1 for switches 4.

In the case of a write operation, data are written, during this period of time, into second data line pairs DBz0–DBzm, XDBz0–XDBzm by a write circuit (not shown) and the written data are transmitted to first data line pairs DLy, XDLy (y represents odd numbers from 0 to n) through switches 4. Further, the data are transmitted to bit line pairs BLx(z+1), XBLx(z+1) (x represents even numbers from 0 to n) through switches 6 so that the data are written into memory cells 7 connected to word line WLc through selection gates 8.

In the case of a read operation, voltages amplified by sense amplifiers 5 on bit line pairs BLx(z+1), XBLx(z+1) (x represents even numbers from 0 to n) are transmitted, during the same period of time, to first data line pairs DLy, XDLy (y represents odd numbers from 0 to n) through switches 6. Further, the voltages are transmitted to second data line pairs DBz0–DBzm, XDBz0–XDBzm through switches 4. The voltages on second data line pairs DBz0–DBzm, XDBz0–XDBzm are amplified by read amplifiers (not shown) and the read out data are output.

Whether in read operation or in write operation, the precharging of the first data line pairs are performed while bit line pairs BL, XBL and first data line pairs DL, XDL are disconnected upon turning off of switches 6.

After the precharging of first data line pairs DL, XDL, gate signal Yz–1 for switches 6 makes a transition from low level to high level so that bit line pairs BLy(z+1), XBLy(z+1) (y represents odd numbers from 0 to n) and first data line pairs DLy, XDLy (y represents odd numbers from 0 to n) are connected together.

In the case of a write operation, data are written, during this period of time, into second data line pairs DBz0–DBzm, XDBz0–XDBzm by a write circuit (not shown) and the written data are transmitted to first data line pairs DLy, XDLy (y represents even number from 0 to n) through switches 4. Further, the data are transmitted to bit line pairs BLy(z+1), XBLy(z+1) (y represents odd numbers from 0 to n) through switches 6 so that the data are written into memory cells 7 connected to word line WLc through selection gates 8.

In the case of a read operation, voltages amplified by sense amplifiers 5 on bit line pairs BLy(z+1), XBLy(z+1) (y represents odd numbers from 0 to n) are transmitted, during the same period of time, to first data line pairs DLy, XDLY (y represents odd numbers from 0 to n) through switches 6. Further, the voltages are transmitted to second data line pairs DBz0–DBzm, XDBz0–XDBzm through switches 4. The voltages on second data line pairs DBz0–DBzm, XDBz0–XDBzm are amplified by read amplifiers (not shown) and the read out data are output.

After the completion of the write operation/read operation, if it is needed to access memory cells connected to another word line in the same memory block, a precharging operation is carried out for preparation of next command receiving (refer to fourth, fifth, eighth, ninth, 13th, 14th, 17th, and 18th clock cycles in FIG. 10).

A case where access is made to memory cells connected to other second data line pairs DBz0–DBzm, XDBz0–XDBzm and word line WLb and to memory cells connected to second data line pairs DB00–DB0m, XDB00–XDB0m and word line WLd will be described with reference to FIG. 10.

When a control signal is fed in synchronized with rising edges of fifth and 14th CLK, word line WLb at the address designated by the control signal makes a transition from low level to high level. When word line WLb has made the transition to a high level, the data in memory cells 7 connected to word line WLb are placed on bit line XBL01–XBLn2. Then, sense amplifier starting signals SP0, SP1 (not shown) of the memory block designated by the control signal make a transition from precharge level to high level. Then, when signals SN0, SN1 (not shown) make a transition from precharge level to low level, sense amplifiers 5 are started and voltages on bit line pair BL01–BLn2, XBL01–XBLn2 are amplified by the sense amplifiers. Then, gate signal Y0-0 for switches 6 makes a transition from low level to high level so that bit line pairs BLx1, XBLx1 (x represents even numbers from 0 to n) is connected with first data line pairs DLx, XDLx (x represents even numbers from 0 to n). Further, second data line pairs DBz0–DBzm, XDBz0–XDBzm selected by the control signal and first data line pairs DLx, XDLx (x represents even numbers from 0 to n) are connected together upon a transition from low level to high level of gate signal TGz-0 for switches 4.

In the case of a write operation, data are written, during this period of time, into second data line pairs DBz0–DB0m, XDBz0–XDB0m by a write circuit (not shown) and the written data are transmitted to first data line pairs DLx, XDLx (x represents even numbers from 0 to n) through switches 4. Further, the data are transmitted to bit line pairs BLx1, XBLx1 (x represents even numbers from 0 to n) through switches 6 so that the data are written into memory cells 7 connected to word line WLb through selection gates 8.

In the case of a read operation, voltages amplified by sense amplifiers 5 on bit line pairs BLx1, XBLx1 (x represents even numbers from 0 to n) are transmitted, during the same period of time, to first data line pairs DLx, XDLx (x represents even numbers from 0 to n) through switches 6. Further, the voltages are transmitted to second data line pairs DBz0–DBzm, XDBz0–XDBzm through switches 4. The voltages on second data line pairs DBz0–DBzm, XDBz0–XDBzm are amplified by read amplifiers (not shown) and the read out data are output.

Whether in read operation or in write operation, the precharging of the first data line pairs are performed while bit line pairs BL, XBL and first data line pairs DL, XDL are disconnected upon turning off of switches 6.

After the precharging of first data line pairs DL, XDL, gate signal Y0–1 for switches 6 makes a transition from low level to high level so that bit line pairs BLy1, XBLy1 (y represents odd numbers from 0 to n) and first data line pairs DLx, XDLx (x represents even numbers from 0 to n) are connected together.

In the case of a write operation, data are written, during this period of time, into second data line pairs DBz0–DBzm, XDBz0–XDBzm by a write circuit (not shown) and the written data are transmitted to first data line pairs DLx, XDLx (x represents even number from 0 to n) through switches 4. Further, the data are transmitted to bit line pairs BLy1, XBLy1 (y represents odd numbers from 0 to n) through switches 6 so that the data are written into memory cells 7 connected to word line WLb through selection gates 8.

In the case of a read operation, voltages amplified by sense amplifiers 5 on bit line pairs BLy1, XBLy1 (y represents odd numbers from 0 to n) are transmitted, during the same period of time, to first data line pairs DLx, XDLx (x represents even numbers from 0 to n) through switches 6. Further, the voltages are transmitted to second data line pairs DBz0–DBzm, XDBz0–XDBzm through switches 4. The voltages on second data line pairs DBz0–DBzm, XDBz0–XDBzm are amplified by read amplifiers (not shown) and the read out data are output.

When access is that to a memory cell array other than the memory cell array designated by the control signal at the fifth or 14th, to a memory block not related to the second line pairs or access to the second line pairs itself, continuous operation can be made. Operation relative to it will be described below.

When a control signal is fed in synchronized with the rising edges of the sixth and 15th clocks in FIG. 10 for accessing a memory cell array different from that designated at the fifth and 14th clock cycles, word line WLd at the address designated by the control signal makes a transition from low level to high level. Following the transition of word line WLd to a high level, data in memory cells 7 connected to word line WLd are placed on bit line XBL0(z+1)–XBLn(z+2). Then, sense amplifier starting signals SPz, SP(z+1) (not shown) for the memory cell array designated by the control signal make a transition from precharge level to high level. Following a transition from precharge level to low level of SNz, SN(z+1) (not shown), sense amplifiers 5 are started, so that bit line pairs BL0(z+1)–BLn(z+2), XBL0(z+1)–XBLn(z+2) are amplified by the sense amplifiers. Then, gate signal Yz-0 for switches 6 makes a transition from low level to high level, so that bit line pairs BLx(z+1), XBLx(z+1) (x represents even numbers from 0 to n) are connected with first data line pairs DLy, XDLy (x represents odd numbers from 0 to n). Further, second data line pairs DB00–DB0m, XDB00–XDB0m selected by the control signal and first data line pairs DLy, XDLy (x represents odd numbers from 0 to n) are connected together upon a transition from low level to high level of gate signal TG0–1 for switches 4.

In the case of a write operation, data are written, during this period of time, into second data line pairs DB00–DB0m, XDB00–XDB0m by a write circuit (not shown) and the written data are transmitted to first data line pairs DLy, XDLy (y represents odd numbers from 0 to n) through switches 4. Further, the data are transmitted to bit line pairs BLx(z+1), XBLx(z+1) (x represents even numbers from 0 to n) through switches 6, so that the data are written into memory cells 7 connected to word line WLd through selection gates 8.

In the case of a read operation, voltages amplified by sense amplifiers 5 on bit line pairs BLx(z+1), XBLx(z+1) (x represents even numbers from 0 to n) are transmitted, during the same period of time, to first data line pairs DLy, XDLy (y represents odd numbers from 0 to n) through switches 6. Further, the voltages are transmitted to second data line pairs DB00–DB0m, XDB00–XDB0m through switches 4. The voltages on second data line pairs DB00–DB0m, XDB00–XDB0m are amplified by a read amplifiers (not shown) and the read out data are output.

Whether in read operation or in write operation, the precharging of the first data line pairs are performed while bit line pairs BL, XBL and first data line pairs DL, XDL are disconnected upon turning off of switches 6.

After the precharging of first data line pairs DL, XDL, gate signal Yz–1 for switches 6 makes a transition from low level to high level, so that bit line pairs BLy(z+1), XBLy (z+1) (y represents odd numbers from 0 to n) and first data lines DLy, XDLy (y represents odd numbers from 0 to n) are connected together.

In the case of a write operation, data are written, during this period of time, into second data line pairs DB00–DB0m, XDB00–XDB0m by a write circuit (not shown) and the written data are transmitted to first data line pairs DLy, XDLy (y represents odd number from 0 to n) through switches 4. Further, the data are transmitted to bit line pairs BLy(z+1), XBLy(z+1) (y represents odd numbers from 0 to n) through switches 6, so that the data are written into memory cells 7 connected to word line WLd through selection gates 8.

In the case of a read operation, voltages amplified by sense amplifiers 5 on bit line pairs BLy(z+1), XBLy(z+1) (y represents odd numbers from 0 to n) are transmitted, during the same period of time, to first data line pairs DLy, XDLy (y represents odd numbers from 0 to n) through switches 6. Further, the voltages are transmitted to second data line pairs DB00–DB0m, XDB00–XDB0m through switches 4. The voltages on second data line pairs DB00–DB0m, XDB00–XDB0m are amplified by read amplifiers (not shown) and the read out data are output.

Thus, according to the fourth embodiment, by arranging first data line pairs to be separately corresponding to each memory cell array, it is made possible to perform access, continuously with first access, to a memory block different from that accessed first, through second data line pairs different from that used in the first access. Therefore, data transfer to and from a plurality of memory blocks can be continuously performed without producing contention, so that a great improvement in the bandwidth of the system can be realized. Incidentally, in the fourth embodiment, an example in which first data line pairs correspond to two memory cell arrays were shown. The number of correspondence of first data line pairs to memory cell arrays can be easily adjusted by changing connections of switches 6 and switches 4. Further, by making it the same as the number of blocks of the second data line pairs (this configuration is a typical full cross-bar connection system which makes possible simultaneous access with each memory block) such a system in which continuous access from all of the blocks of the second data line pairs are possible can be structured and, thus, bus contention can be completely avoided. In addition, each of neighbor bit line pairs should be assigned to "n-th" bit of the pitch matched processor input/output line pairs, via first data line pairs and second data line pairs of corresponding "n-th" bit, for fast data transfer.

(Fifth Exemplary Embodiment)

Fifth exemplary embodiment is configured by having a plurality of processor elements connected with the memory of the first embodiment, memory of the second embodiment, or memory of the fourth embodiment by second data line pairs of the memory and having them integrated on one chip.

Figure 11:
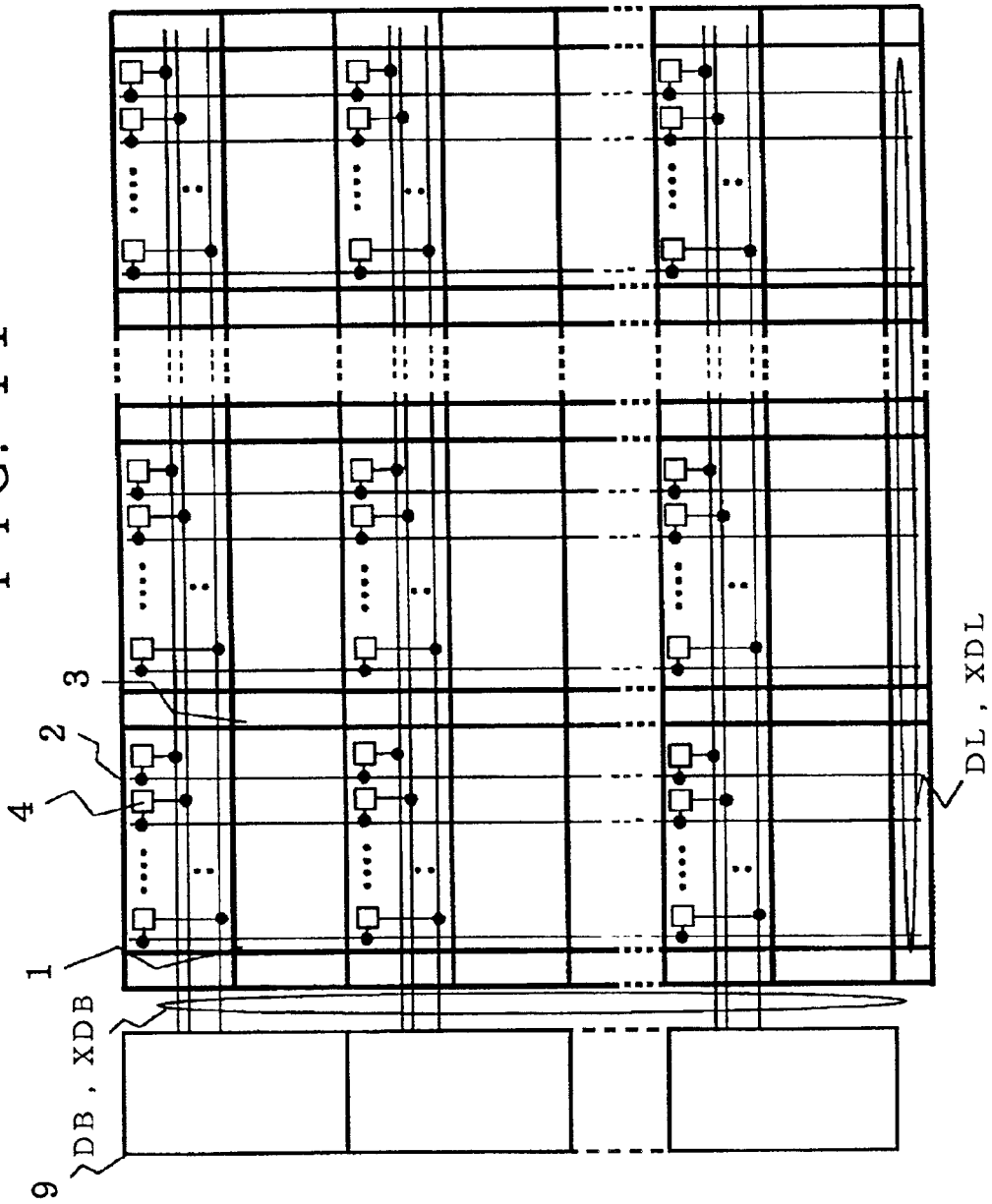
FIG. 11 is a system diagram of a semiconductor memory according to the fifth embodiment of the invention.
Figure 12:
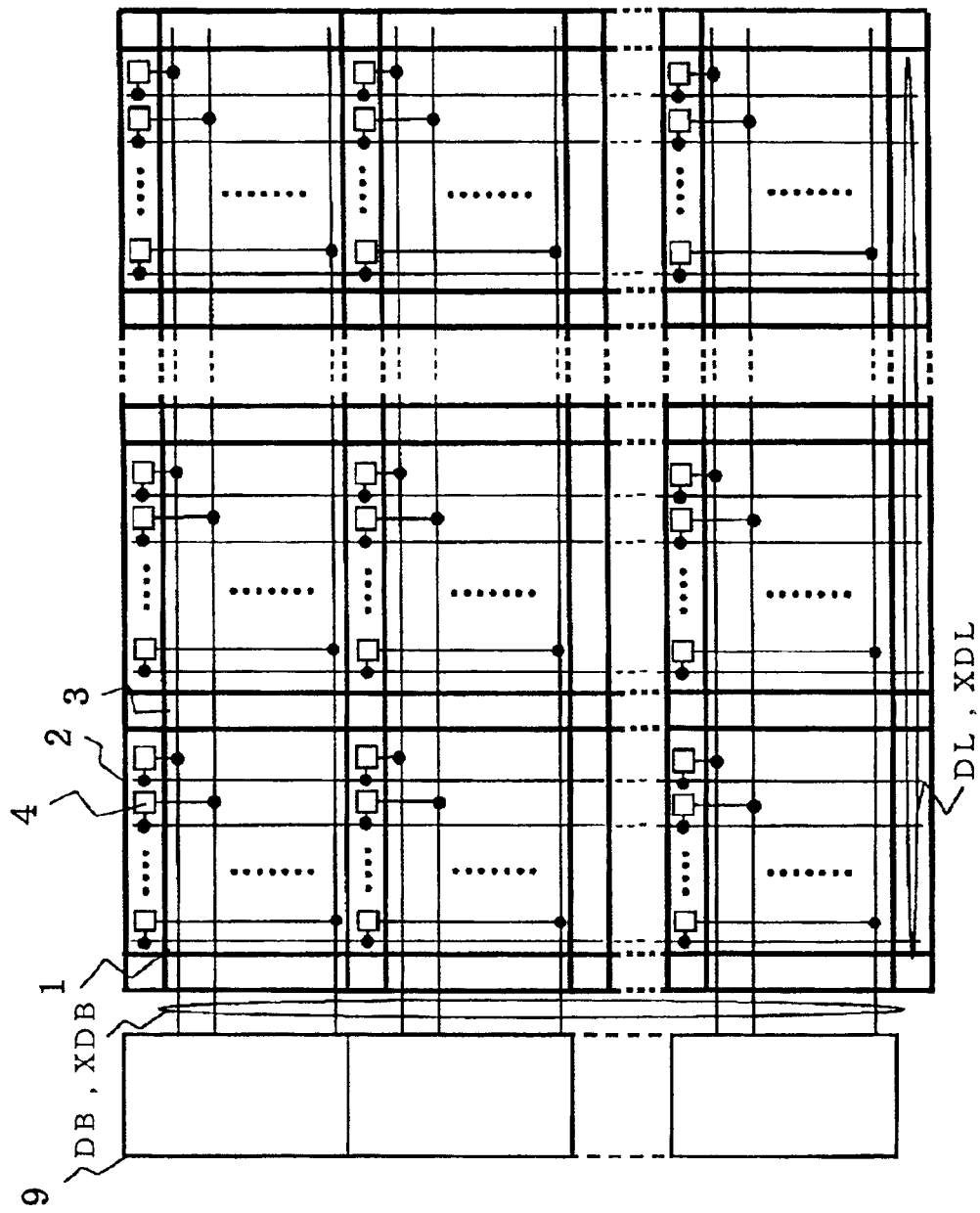
FIG. 12 is a system diagram of a semiconductor memory according to the fifth embodiment of the invention.
Figure 13:
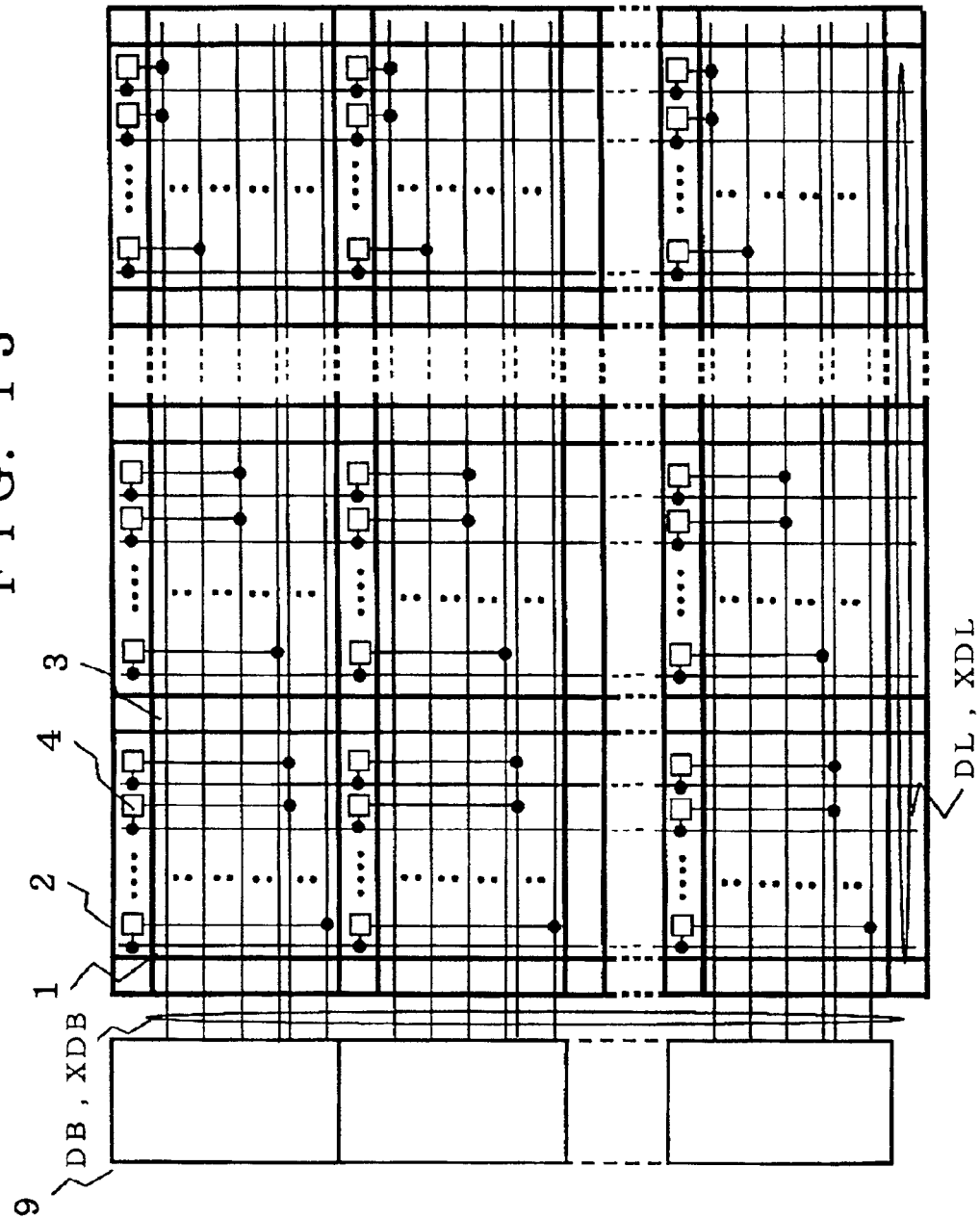
FIG. 13 is a system diagram of a semiconductor memory according to the fifth embodiment of the invention.

In FIG. 11, a plurality of processor elements 9 are connected with the memory of the first embodiment by second data line pairs (DB, XDB) and these elements are integrated on one chip. In FIG. 12, a plurality of processor elements 9 are connected with the memory of the second embodiment by second data line pairs (DB, XDB) and these elements are integrated on one chip. In FIG. 13, a plurality of processor elements 9 are connected with the memory of the fourth embodiment by second data line pairs (DB, XDB) and these elements are integrated on one chip.

In FIG. 11 to FIG. 13, one processor element is connected with second data line pairs related to one memory cell array. Further, each memory cell array, within the memory, is connected with first data line pairs. In other words, crossbar wirings and crossbar switches are formed within the memory. Therefore, when a plurality of memory cell arrays and a plurality of processor elements of the present invention are integrated on one chip, the crossbar wirings and crossbar switches are formed within the memory. Accordingly, the present invention has an advantage that the chip area is prevented from increasing. Although the case where crossbar switches are formed within the memory has so far been described, it is of course possible to form the crossbar switches within the processor elements.

Processor elements 9 and the memory cell arrays are arranged at the same pitch. When they are integrated on one chip, the number of processor elements 9 and the number of the memory cell arrays may be selected according to the need.

(Sixth Exemplary Embodiment)

Sixth exemplary embodiment is that related to arbitration of requests for accessing from one or more processor elements to one memory cell array.

The arbitration function in the fifth embodiment is incorporated in the processor element. When a plurality of processor elements request for access to one memory cell array, arbitration among the processor elements is made and the access request from only one processor element is enabled. In accordance with a signal (not shown) from the processor enabled to access, switches 4 for connecting first data line pairs (DL, XDL) within the memory and second data line pairs (DB, XDB) connected to the processor element enabled to access is turned ON and, thereby, accessing for data transferred between the memory and processor is performed.

Figure 14:
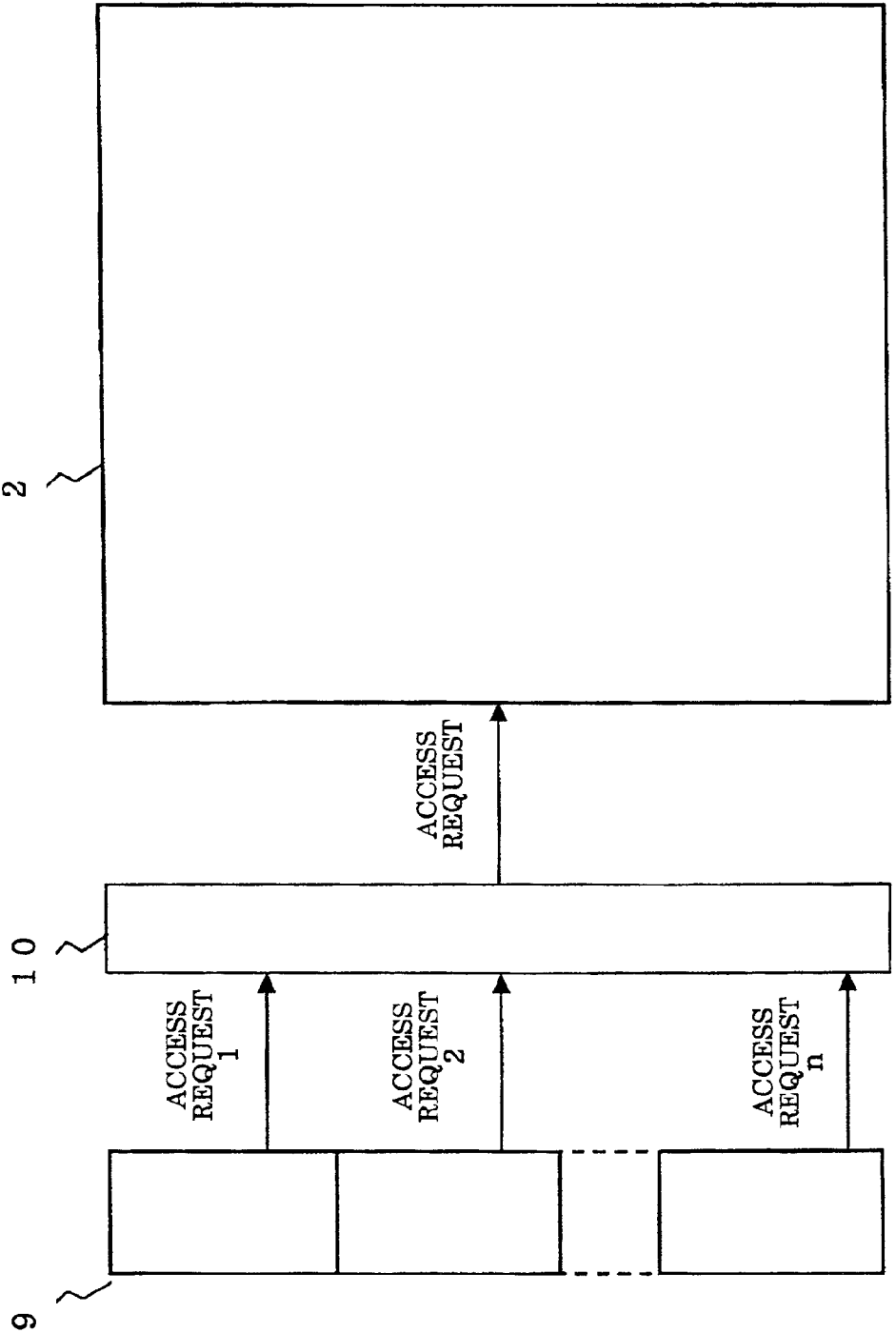
FIG. 14 is a diagram showing an example of processing in a semiconductor memory according to a sixth embodiment of the invention.

FIG. 14 is a diagram schematically showing an example of arbitration of access requests from processor elements 9 to one cell array 1. A case where n processor elements 9 are integrated will be described.

When n access requests to cell array 1 are simultaneously made by processor elements 9 operating independently of one another, arbiter circuit 10 arbitrates among the n access requests. Arbiter circuit 10 allots priority levels to the n access requests and outputs the access requests to the memory in order of priority. Here, arbiter circuit 10 accepts a next access request when communications between the memory and processor element 9 based on a preceding access request have been finished.

According to the present embodiment, since the crossbar system can be provided in a small chip form, a memory-embedded multiprocessor mounting a crossbar system can be realized on one chip. Therefore, a high-speed and low-power system, which has so far been realized on multiple chips, can be provided.

(Seventh Exemplary Embodiment)

Seventh exemplary embodiment is related to arbitration of requests for access from one or more processor elements to one or more memory cell arrays.

Figure 15:
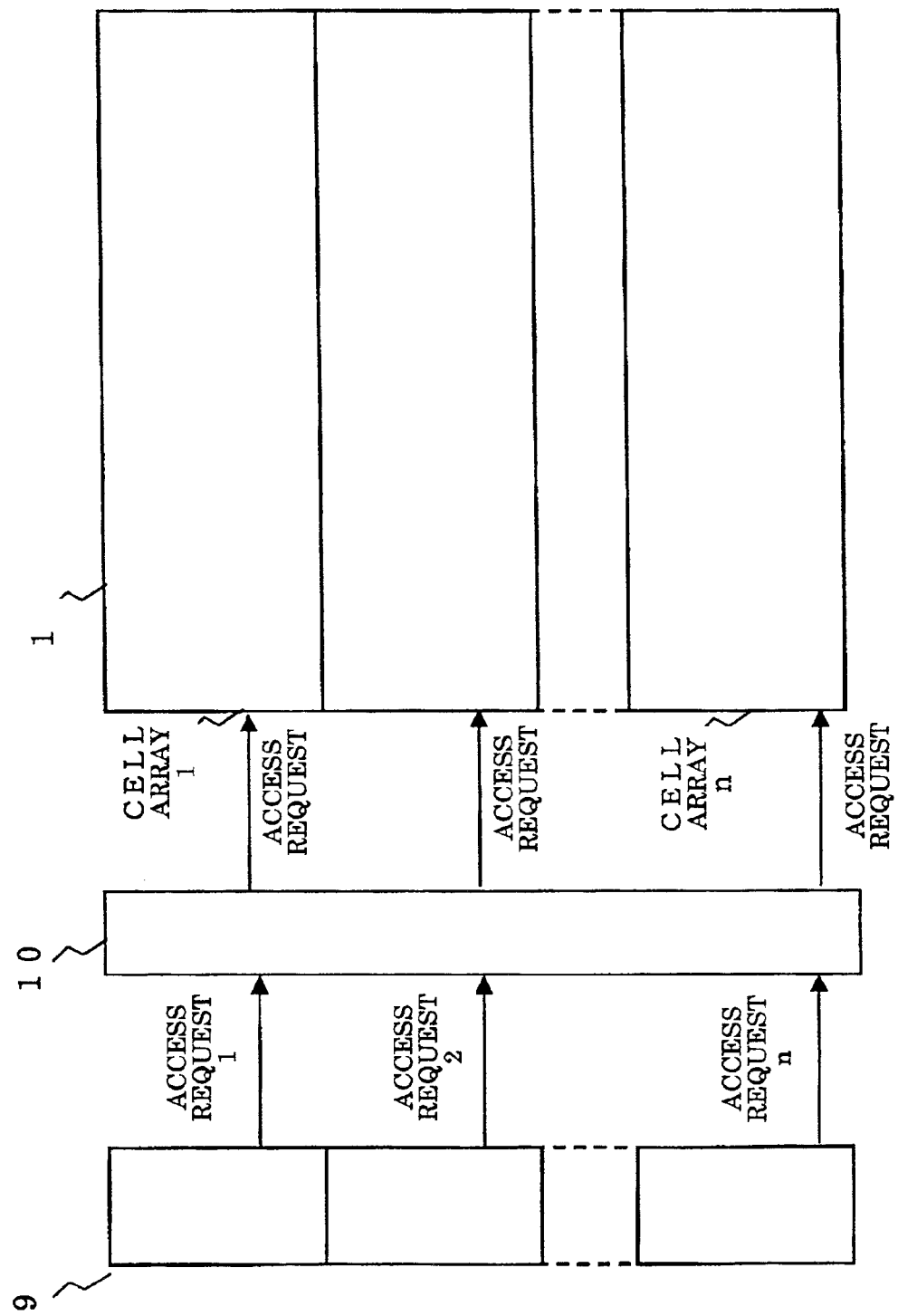
FIG. 15 is a diagram showing an example of processing in a semiconductor memory according to a seventh embodiment of the invention.
Figure 16:
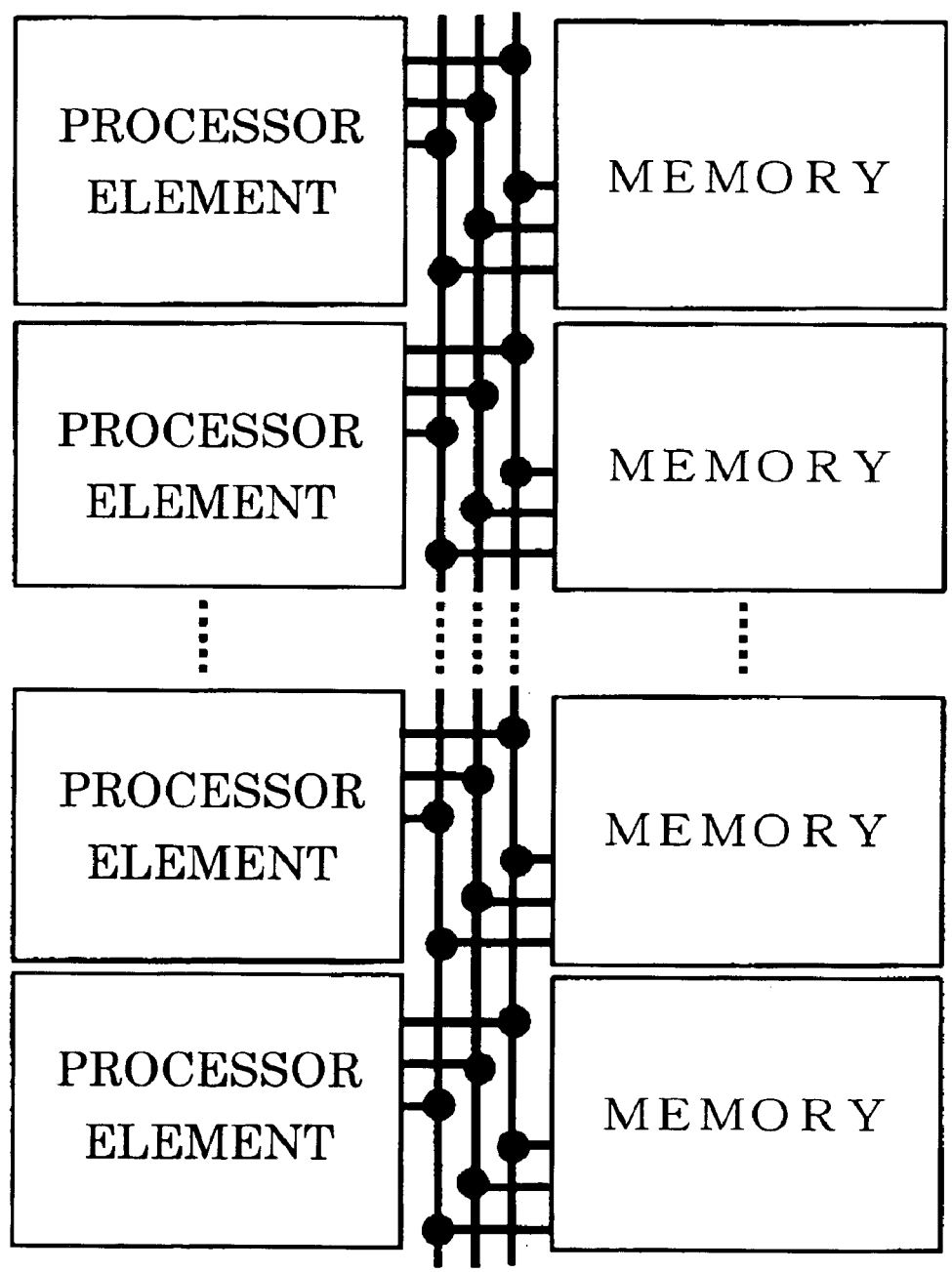
FIG. 16 is a system diagram of a semiconductor memory of a prior art.
Figure 17:
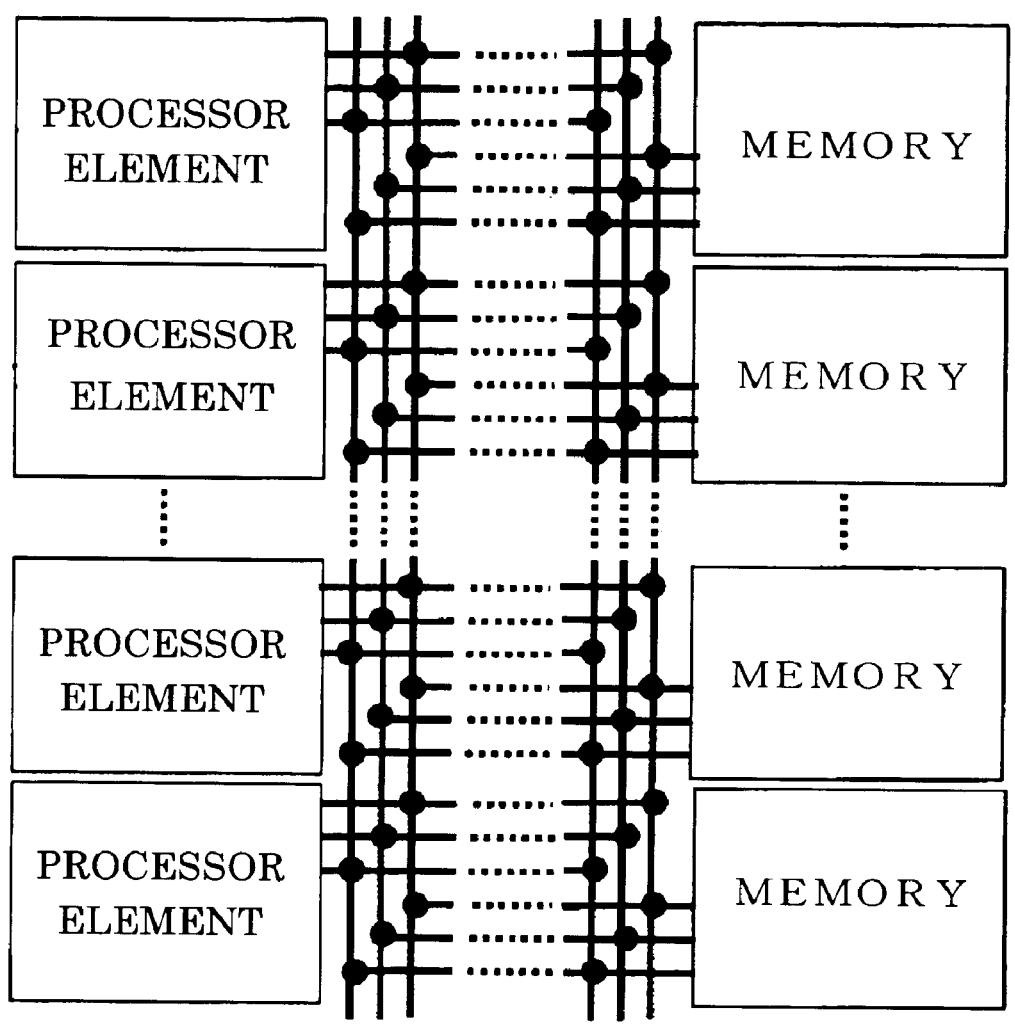
FIG. 17 is a system diagram of a semiconductor memory of a prior art.
Figure 18:
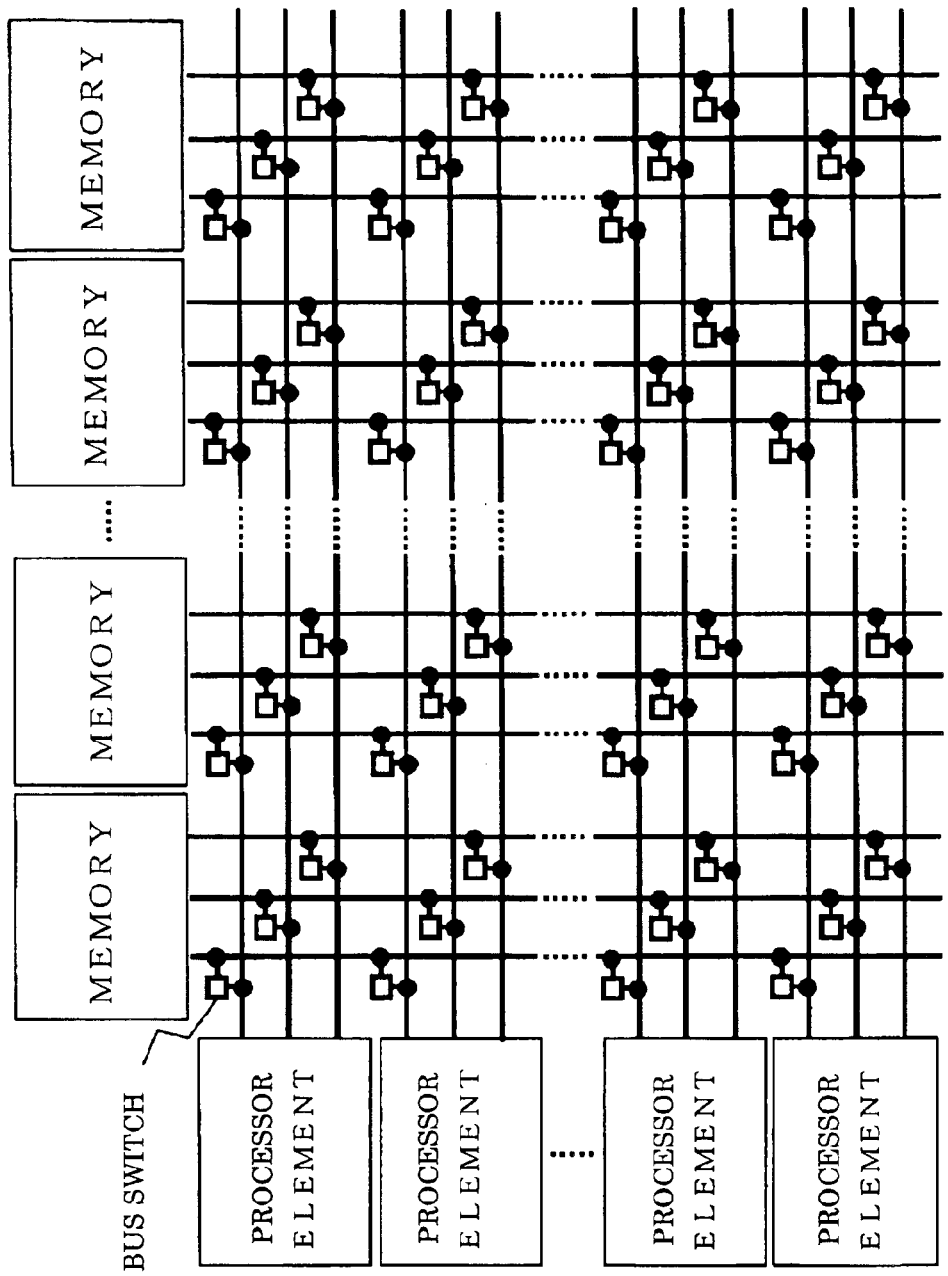
FIG. 18 is a system diagram of a semiconductor memory of a prior art.

FIG. 15 is a diagram schematically showing an example of arbitration among accessing requests from multiple processor elements 9 to multiple cell arrays 1–m. In FIG. 15, it is arranged such that a plurality of accessing requests to cell array 1 are simultaneously issued from arbiter circuit 10 of FIG. 14. Nine sets of processor elements are integrated. For simplicity, a case where n=m will be described.

When n accessing requests to cell arrays 1–n are simultaneously made by processor elements 9 operating independently of one another, arbiter circuit 10 arbitrates the n access requests. Arbiter circuit 10 allots priority levels to the n access requests by means of hardware or software and accepts the memory access requests according to the priority level. Here, arbiter circuit 10 checks whether any of the access requests are to the same memory cell array k. If no access requests are to the same memory cell array k (not shown), the memory access requests are accepted at the same time. If some of them are to the same memory cell array k, a next access request is accepted after communications between the cell array k and processor element 9 based on a preceding access request have been finished.

Operations in the present embodiment will be described as follows. The operations are performed through the step for processor elements to make access requests to memory cell arrays, the step for the arbiter circuits belonging to the memory cell arrays, which are requested to access, to make arbitration, and the step at which data communications are made between processor elements and memory cell arrays in accordance with the result of arbitration. The arbiter circuits each have the arbitration signal for each memory cell array.

INDUSTRIAL APPLICABILITY

Since the crossbar system according to the present embodiment can be provided in a small chip form, the memory-embedded multiprocessor mounting the crossbar system can be realized on one chip. If separate memory cell arrays are used, it becomes possible to make accesses between a plurality of processor elements 9 and a plurality of memory cell arrays simultaneously and, therefore, a system of higher speeds can be realized. Thus, according to the present invention, by having crossbar wirings arranged on memory cell arrays, a high-speed and high-performance memory-embedded multiprocessor can be provided without increasing the chip area.

What is claimed is:

1. A semiconductor memory comprising:

one or a plurality of processor elements having arithmetic functions;

a plurality of memory cells arranged in a matrix array;

a plurality of bit line pairs each thereof being connected to each column of the plurality of the memory cells;

a plurality of sense amplifiers each connected to each bit line pair;

a plurality of first gate pairs;

a plurality of second gate pairs;

a plurality of first data line pairs each connected with one of the bit line pairs selected via the first gate pairs, and said first data line pairs are dedicated for a predetermined column sub-block of the memory cells, on activation; and a plurality of second data line pairs each connected with one of the first data line pairs via the second gate pairs to select a predetermined row of sub-block data consisting of crossbar crosspoint, and said plurality of processor elements are connected to said plurality of second data line pairs, wherein the first data line pair and the second data line pair are arranged to intersect each other, and said first gate pairs and said second gate pairs are adjacent to said plurality of sense amplifiers.

* * * * *